United States Patent
Nishi et al.

(10) Patent No.: US 12,002,806 B2
(45) Date of Patent: Jun. 4, 2024

(54) REVERSE CONDUCTING SEMICONDUCTOR DEVICE AND METHOD FOR MANUFACTURING REVERSE CONDUCTING SEMICONDUCTOR DEVICE

(71) Applicant: Mitsubishi Electric Corporation, Tokyo (JP)

(72) Inventors: Koichi Nishi, Tokyo (JP); Shinya Soneda, Tokyo (JP); Takahiro Nakatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 228 days.

(21) Appl. No.: 17/402,842

(22) Filed: Aug. 16, 2021

(65) Prior Publication Data

US 2022/0122966 A1 Apr. 21, 2022

(30) Foreign Application Priority Data

Oct. 21, 2020 (JP) .................................. 2020-176470

(51) Int. Cl.
| | |
|---|---|
| H01L 27/07 | (2006.01) |
| H01L 29/06 | (2006.01) |
| H01L 29/66 | (2006.01) |
| H01L 29/739 | (2006.01) |
| H01L 29/861 | (2006.01) |

(52) U.S. Cl.
CPC ...... *H01L 27/0727* (2013.01); *H01L 29/0619* (2013.01); *H01L 29/0692* (2013.01); *H01L 29/0696* (2013.01); *H01L 29/66136* (2013.01); *H01L 29/66348* (2013.01); *H01L 29/7397* (2013.01); *H01L 29/861* (2013.01); *H01L 29/8613* (2013.01)

(58) Field of Classification Search
None
See application file for complete search history.

(56) References Cited

U.S. PATENT DOCUMENTS

2014/0231867 A1* 8/2014 Yamashita .......... H01L 29/7813
257/140
2015/0295042 A1 10/2015 Kameyama et al.

FOREIGN PATENT DOCUMENTS

| JP | 5103820 B2 | 12/2012 |
|---|---|---|
| JP | 2015-231037 A | 12/2015 |
| WO | 2014097454 A1 | 6/2014 |

* cited by examiner

*Primary Examiner* — Erik T. K. Peterson
*Assistant Examiner* — Jeremy Evan Sylvester
(74) *Attorney, Agent, or Firm* — Studebaker & Brackett PC

(57) ABSTRACT

The semiconductor substrate has a first principal surface and a second principal surface. The base contact layer is arranged between the base layer and the first principal surface, and forms a part of the first principal surface. The anode contact region is arranged between the anode layer and the first principal surface, forms a part of the first principal surface, and has a second conductivity type impurity concentration peak value higher than that of the anode layer. The anode contact region includes a first anode contact layer having a lower net concentration and a higher first conductivity type impurity concentration than the base contact layer.

13 Claims, 27 Drawing Sheets

F I G. 3
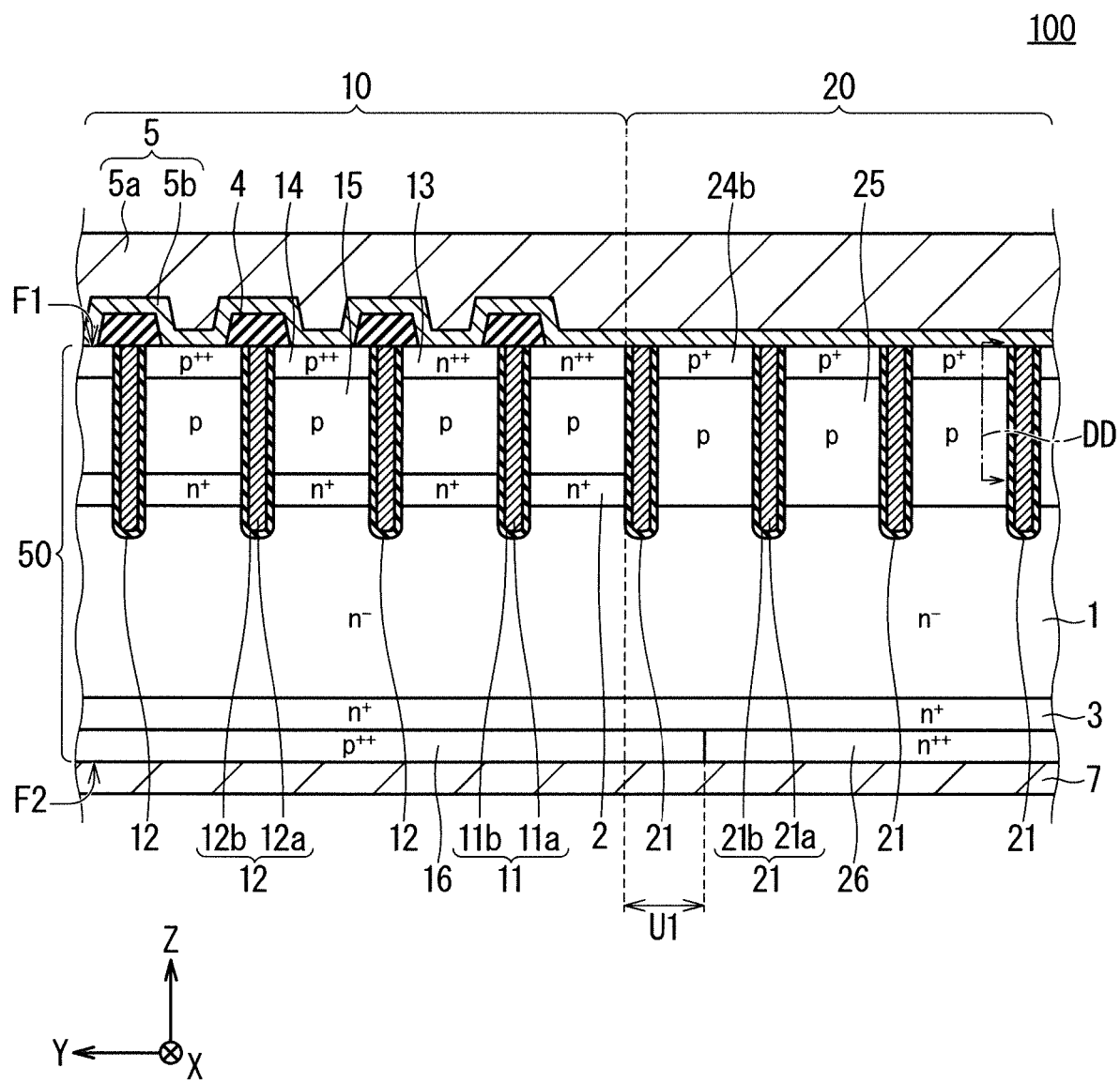

REVERSE CONDUCTING SEMICONDUCTOR DEVICE AND METHOD FOR MANUFACTURING REVERSE CONDUCTING SEMICONDUCTOR DEVICE

BACKGROUND OF THE INVENTION

Field of the Invention

The present disclosure relates to a reverse conducting semiconductor device and a method for manufacturing the reverse conducting semiconductor device.

Description of the Background Art

From the viewpoint of energy saving, an insulated gate bipolar transistor (IGBT) and a freewheeling diode are used for a power module or the like that performs variable speed control of a three-phase motor in the fields of general-purpose inverters, AC servos, and the like. In that case, using a reverse conducting semiconductor device having an IGBT region and a diode region, that is, a reverse conducting IGBT (RC-IGBT) allows the area occupied by the IGBT and the diode in the power module to be reduced as compared with using both the semiconductor device as the IGBT and the semiconductor device as the freewheeling diode (diode for reverse conduction). Therefore, the power module can be reduced in size.

For example, WO/2014/097454 discloses a semiconductor device in which an IGBT region and a diode region are formed on the same semiconductor substrate. The IGBT region includes a collector layer, an IGBT drift layer, a gate electrode, an emitter layer, a body layer, and a body contact layer having a high impurity concentration. The diode region includes a trench electrode, a diode drift layer, a cathode layer, an anode layer, and an anode contact layer having a high impurity concentration. The diode region is partitioned into unit diode regions by a gate electrode or a trench electrode. In the unit diode region adjacent to the IGBT region, when the surface of the semiconductor substrate is viewed in a plan, the anode layer and the anode contact layer are arranged in a mixed manner, and the anode contact layer is arranged at least at a position facing the emitter layer across the gate electrode. In this semiconductor device, in the unit diode region adjacent to the IGBT region, the anode contact layer is not entirely formed but partially formed. With such a configuration, the injection amount of holes from the anode contact layer to the diode drift layer during diode operation is reduced. Thus, recovery loss in the diode region can be reduced.

From the viewpoint of manufacturing efficiency of the semiconductor device, it is preferable to collectively form the anode contact layer and the body contact layer by a common ion implantation step. In that case, the anode contact layer and the body contact layer have substantially the same impurity concentration. When the impurity concentration is increased, the injection amount of holes from the anode contact layer to the diode drift layer increases, so that recovery loss in the diode region increases. Conversely, when the impurity concentration is made lower, the latch-up tolerance in the IGBT region tends to be insufficient. In order to improve this trade-off, it is suitable to make the impurity concentration of the anode contact layer lower than the impurity concentration of the body contact layer. On the other hand, in order to provide such a concentration difference, it is normally necessary to greatly complicate the impurity doping step, and as a result, the manufacturing cost is greatly increased.

SUMMARY

The present disclosure has been made to solve the above problems, and an object of the present disclosure is to provide a reverse conducting semiconductor device having high latch-up tolerance and low recovery loss while avoiding a significant increase in manufacturing cost.

A reverse conducting semiconductor device having an insulated gate bipolar transistor region and a diode region according to the present disclosure includes a semiconductor substrate, an insulated gate structure, a collector electrode, and an emitter electrode. The semiconductor substrate is included in the insulated gate bipolar transistor region and the diode region, and has a first principal surface and a second principal surface opposite to the first principal surface. The semiconductor substrate includes a drift layer having a first conductivity type, a base layer having a second conductivity type different from the first conductivity type, an emitter layer having the first conductivity type, a base contact layer having the second conductivity type, a collector layer having the second conductivity type, an anode layer having the second conductivity type, an anode contact region having the second conductivity type, and a cathode layer having the first conductivity type. The drift layer extends over the insulated gate bipolar transistor region and the diode region. The base layer is arranged between the drift layer and the first principal surface in the insulated gate bipolar transistor region. The emitter layer is arranged between the base layer and the first principal surface in the insulated gate bipolar transistor region. The base contact layer is arranged between the base layer and the first principal surface in the insulated gate bipolar transistor region, and forms a part of the first principal surface. The collector layer is arranged between the drift layer and the second principal surface in the insulated gate bipolar transistor region. The anode layer is arranged between the drift layer and the first principal surface in the diode region. The anode contact region is arranged between the anode layer and the first principal surface in the diode region, forms a part of the first principal surface, and has a second conductivity type impurity concentration peak value higher than that of the anode layer. The cathode layer is arranged between the drift layer and the second principal surface in the diode region. The insulated gate structure is for forming, with the base layer, a channel for controlling an electrical path between the emitter layer and the drift layer. The collector electrode is electrically connected to the collector layer and the cathode layer. The emitter electrode is in contact with the base contact layer and the anode contact region. The anode contact region includes a first anode contact layer having a lower net concentration and a higher first conductivity type impurity concentration than the base contact layer.

A method for manufacturing a reverse conducting semiconductor device for manufacturing the reverse conducting semiconductor device described above includes: a step of performing first conductivity type impurity doping of an emitter layer by ion implantation into a first principal surface of a semiconductor substrate; and a step of performing first conductivity type impurity doping of a first anode contact layer by ion implantation into the first principal surface of the semiconductor substrate. The step of performing first conductivity type impurity doping of the emitter layer and the step of performing first conductivity type impurity doping of the first anode contact layer are simultaneously performed as a common first conductivity type impurity doping step.

According to the reverse conducting semiconductor device of the present disclosure, it is possible to achieve high latch-up tolerance and low recovery loss while avoiding a significant increase in manufacturing cost.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a partial cross-sectional view taken along line III-III FIG. 2;

DESCRIPTION OF THE PREFERRED EMBODIMENTS

Figure 1:
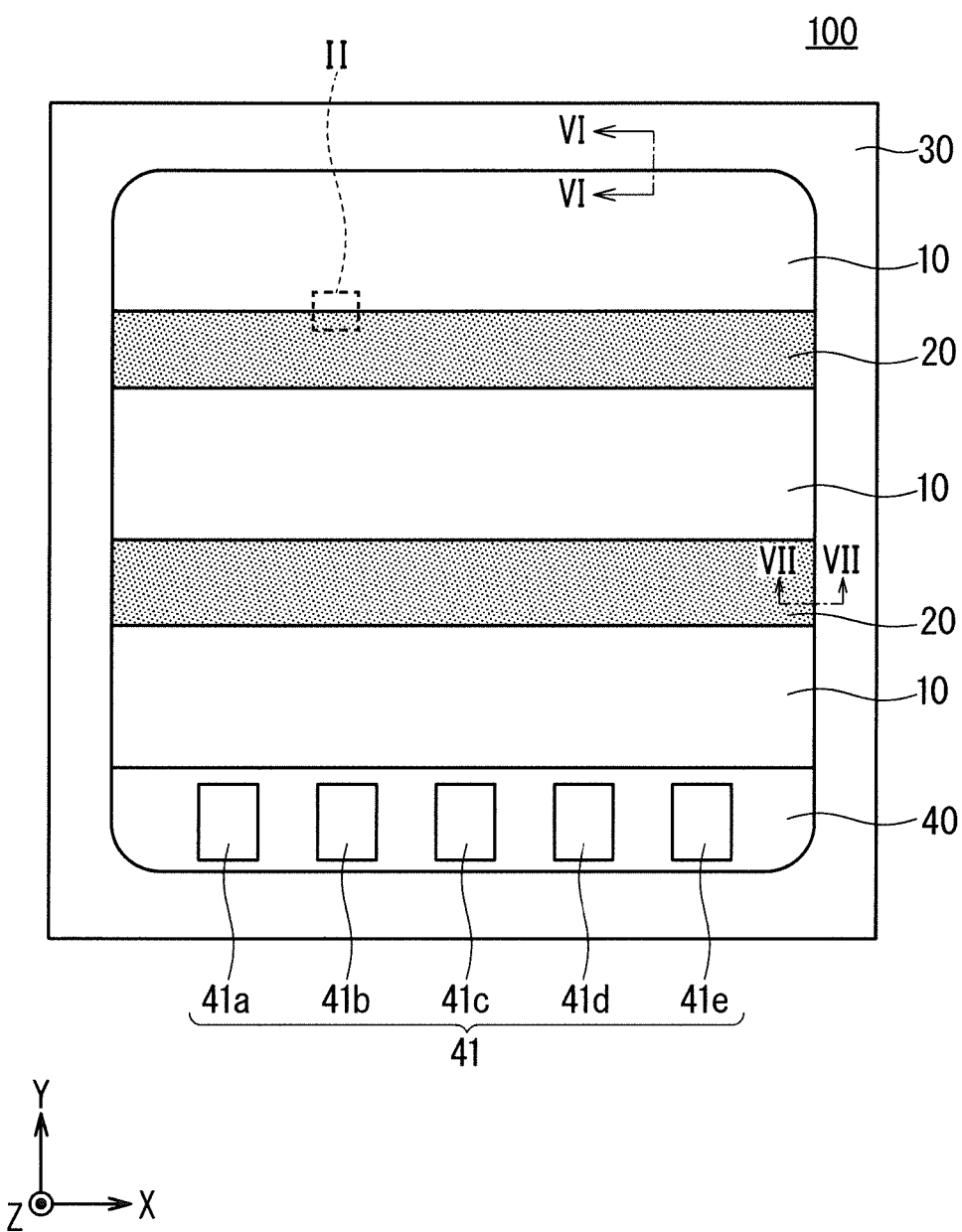
FIG. 1 is a plan view schematically showing a configuration of a reverse conducting semiconductor device according to a first preferred embodiment.

Hereinafter, embodiments will be described with reference to the drawings. It should be noted that in the following drawings, the same or corresponding parts will be denoted by the same reference numerals, and description thereof will not be repeated. In some figures, XYZ orthogonal coordinate axes are shown for clarity of illustration. In the figure, regarding the impurity concentration, $n^-$ indicates that the net concentration is lower than $n^+$, $n^{++}$ indicates that the net concentration is higher than $n^+$, $p^+$ indicates that the net concentration is higher than p, and $p^{++}$ indicates that the net concentration is higher than $p^+$.

Each of the following preferred embodiments will be described when the first conductivity type is n-type and the second conductivity type is p-type, in other words, when the first conductivity type impurities are donors and the second conductivity type impurities are acceptors. Such selection of the conductivity type is a typical selection for obtaining satisfactory properties of the IGBT. However, as a variation, the first conductivity type may be p-type and the second conductivity type may be n-type, and in this variation, the donor and the acceptor in the present specification should be understood by replacing them with each other.

In addition, in the present specification, the net concentration means the absolute value of the difference between the donor concentration and the acceptor concentration, and the net peak concentration means the peak value of the net concentration in the region mentioned. In addition, the numerical value of the concentration is represented by the number of atoms per unit volume.

First Preferred Embodiment (Outline of Configuration)

FIG. 1 is a plan view schematically showing a configuration of an RC-IGBT 100 (reverse conducting semiconductor device) according to the present first preferred embodiment. The RC-IGBT 100 includes an IGBT region 10, a diode region 20, a termination region 30, and a pad region 40 as a planar layout (XY plane layout). It should be noted that in FIG. 1, a dot pattern is assigned to the diode region 20 in order to facilitate viewing the figure. The IGBT region 10 and the diode region 20 are comprehensively referred to as a cell region. The pad region 40 is disposed adjacent to the cell region. The pad region 40 is provided with a control pad 41 for controlling the RC-IGBT 100. A termination region 30 for holding the withstand voltage of the RC-IGBT 100 is arranged around a region including the cell region and the pad region 40.

Figure 2:
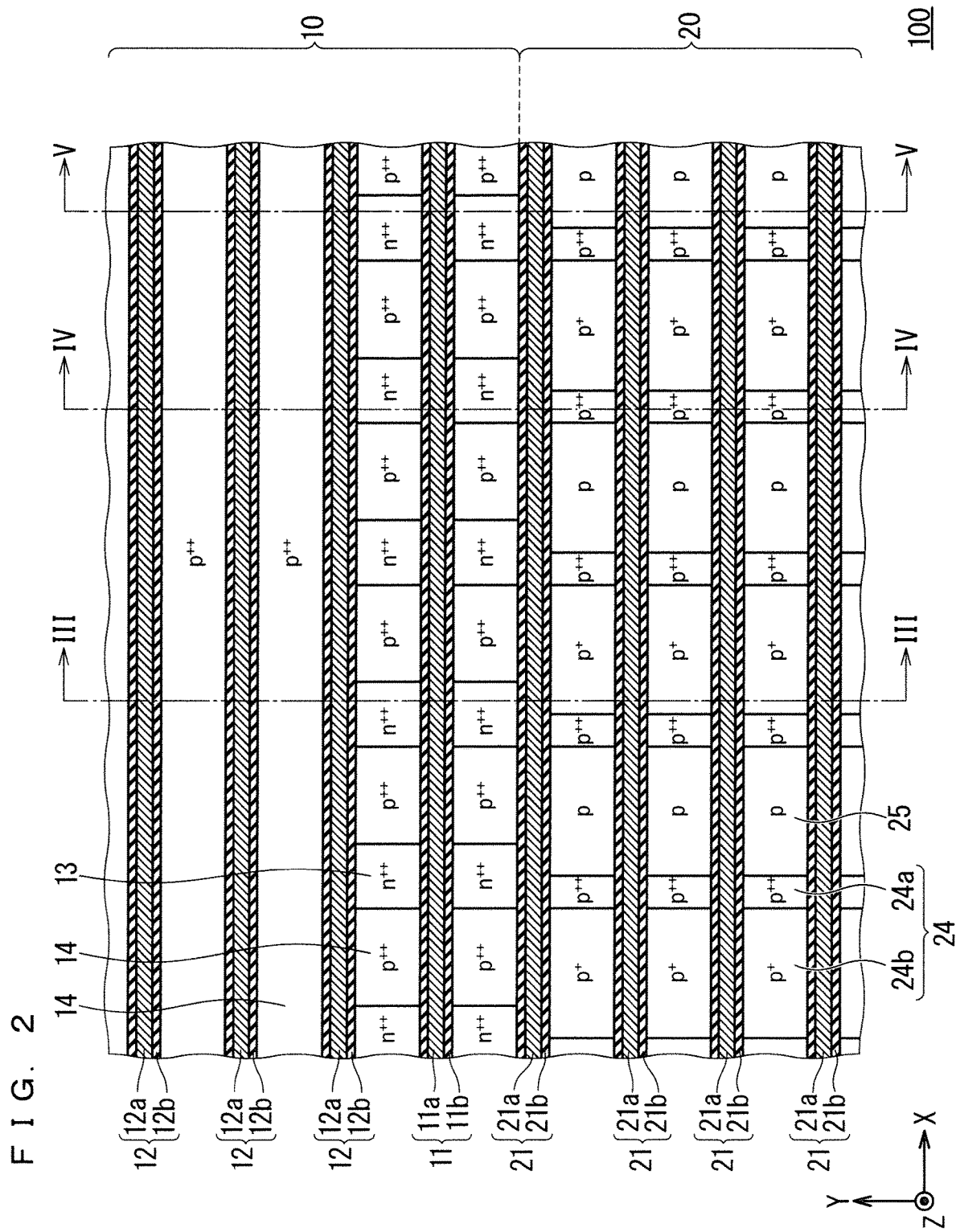
FIG. 2 is a partial plan view schematically showing a configuration of a reverse conducting semiconductor device along a first principal surface of a semiconductor substrate in a region II in FIG. 1.
Figure 4:
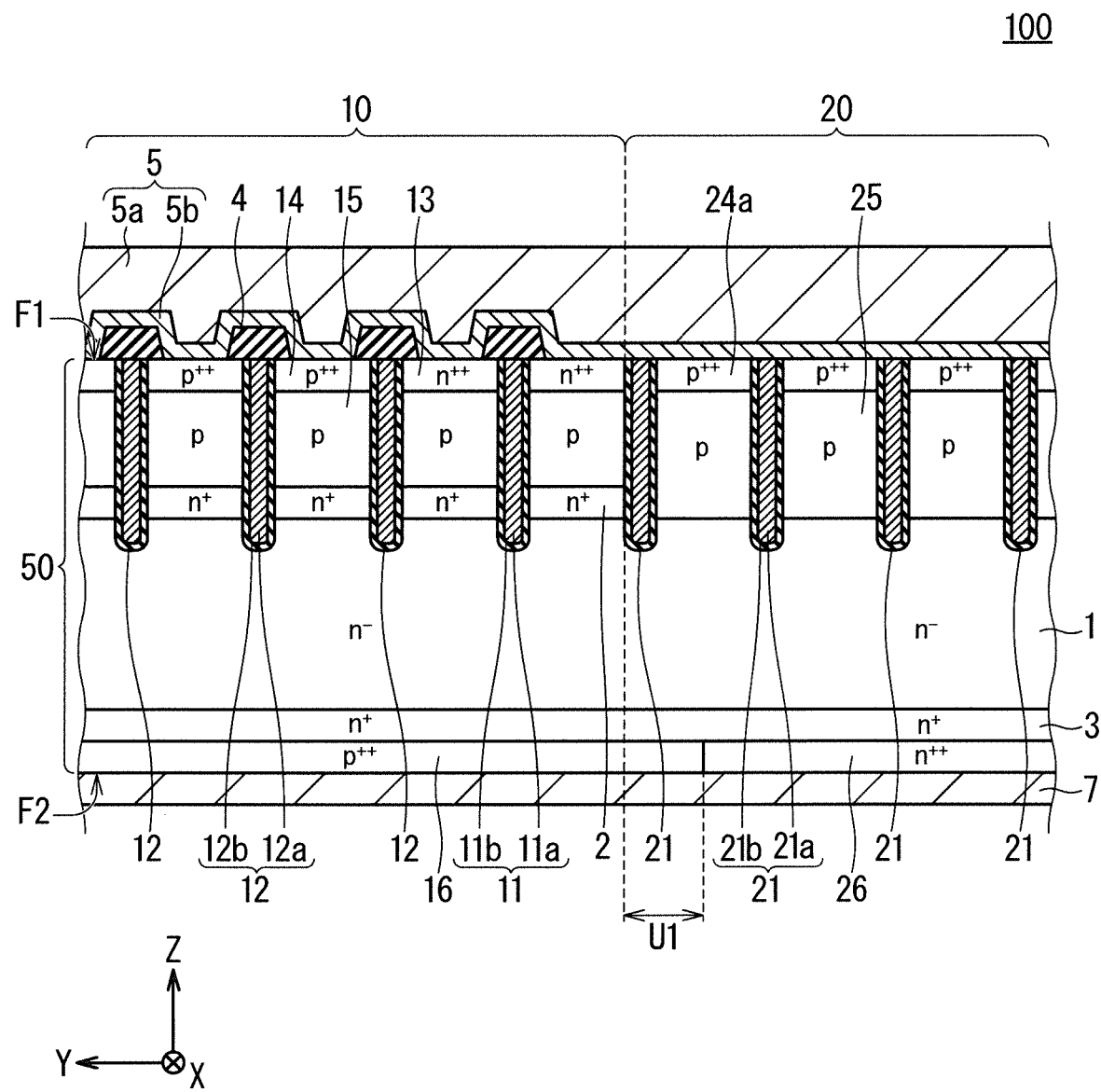
FIG. 4 is a partial cross-sectional view taken along line IV-IV in FIG. 2.
Figure 5:
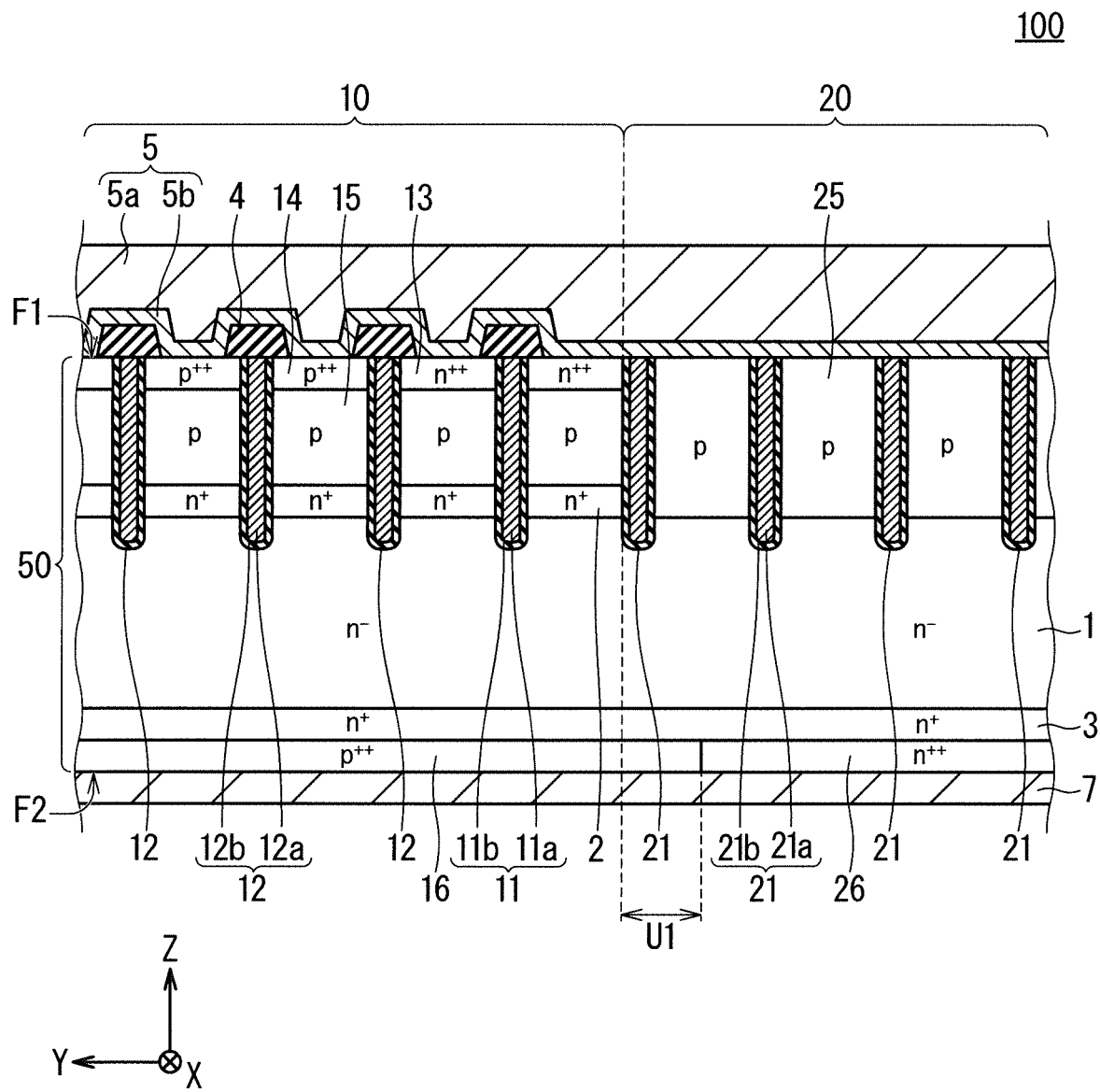
FIG. 5 is a partial cross-sectional view taken along line V-V in FIG. 2.

FIG. 2 is a partial plan view schematically showing the configuration of the RC-IGBT 100 along the first principal surface of the semiconductor substrate 50 in the region II in FIG. 1. FIGS. 3 to 5 are respectively partial cross-sectional views taken along lines III-III, IV-IV, and V-V in FIG. 2. It should be noted that in FIG. 2, a configuration above the first principal surface is not shown in order to facilitate viewing the figure.

The RC-IGBT 100 includes a semiconductor substrate 50, an active trench gate 11 (insulated gate structure), a collector electrode 7, and an emitter electrode 5. The semiconductor substrate 50 is included in the IGBT region 10 and the diode region 20, and has an upper surface F1 (first principal surface) and a lower surface F2 (second principal surface opposite to the first principal surface). Each of the upper surface F1 and the lower surface F2 spans the IGBT region 10 and the diode region 20. In other words, each of the upper surface F1 and the lower surface F2 continuously extends between the IGBT region 10 and the diode region 20. The upper surface F1 preferably has no n-type conductivity in the diode region 20.

The semiconductor substrate 50 includes an $n^-$ drift layer 1 having n-type conductivity, a p-type base layer 15, an n-type emitter layer 13, a $p^{++}$ base contact layer 14 having p-type conductivity, a p-type collector layer 16, a p-type anode layer 25, a p-type anode contact region 24, and a cathode layer 26 having n-type conductivity. The $n^-$ drift layer 1 extends over the IGBT region 10 and the diode region 20. In other words, the $n^-$ drift layer 1 continuously extends between the IGBT region 10 and the diode region 20.

The p-type base layer 15 is disposed between the $n^-$ drift layer 1 and the upper surface F1 in the IGBT region 10. The n-type emitter layer 13 is disposed between the p-type base layer 15 and the upper surface F1 in the IGBT region 10. The $p^{++}$ base contact layer 14 is disposed between the p-type base layer 15 and the upper surface F1 in the IGBT region 10, and forms a part of the upper surface F1. The p-type collector layer 16 is disposed between the $n^-$ drift layer 1 and the lower surface F2 in the IGBT region 10.

The p-type anode layer 25 is disposed between the $n^-$ drift layer 1 and the upper surface F1 in the diode region 20. The net peak concentration of the p-type anode layer 25 is preferably $1 \times 10^{16}/cm^3$ or more. In the present preferred embodiment, as shown in FIG. 5, the p-type anode layer 25 forms a part of upper surface F1. The cathode layer 26 is disposed between the $n^-$ drift layer 1 and the lower surface F2 in the diode region 20. The anode contact region 24 is disposed between the p-type anode layer 25 and the upper surface F1 in the diode region 20, and forms a part of the upper surface F1. The anode contact region 24 has a higher acceptor concentration peak value than the p-type anode layer 25.

The p-type anode contact region 24 includes a $p^+$ anode contact layer 24b (first anode contact layer) and a $p^{++}$ anode contact layer 24a (second anode contact layer). The $p^+$ anode contact layer 24b has a lower net concentration and a higher donor concentration than the $p^{++}$ base contact layer 14. In addition, the $p^+$ anode contact layer 24b has a lower net concentration than the $p^{++}$ anode contact layer 24a. In addition, the $p^+$ anode contact layer 24b has a higher donor concentration than the $p^{++}$ anode contact layer 24a. The net peak concentration of the $p^+$ anode contact layer 24b is $1 \times 10^{18}/cm^3$ or more.

The active trench gate 11 is for forming, with the p-type base layer 15, a channel for controlling an electrical path between the n-type emitter layer 13 and the $n^-$ drift layer 1. The potential of the active trench gate 11 is controlled by applying a potential to the gate pad 41c.

The collector electrode 7 is electrically connected to the p-type collector layer 16 and the cathode layer 26. The collector electrode 7 extends over the IGBT region 10 and the diode region 20. In other words, the collector electrode 7 continuously extends between the IGBT region 10 and the diode region 20. The emitter electrode 5 is in contact with the $p^{++}$ base contact layer 14 and the anode contact region 24. The emitter electrode 5 extends over the IGBT region 10 and the diode region 20. In other words, the emitter electrode 5 continuously extends between the IGBT region 10 and the diode region 20.

(Outline of Manufacturing Method)

In the method for manufacturing the RC-IGBT 100 in the present preferred embodiment, a step of performing donor doping of the n-type emitter layer 13 and a step of performing donor doping of the p+ anode contact layer 24*b* are simultaneously performed as a common donor doping step (described below with reference to FIGS. 11 and 12). In addition, a step of performing acceptor doping of the p$^{++}$ base contact layer 14 and a step of performing acceptor doping of the p$^+$ anode contact layer 24*b* are simultaneously performed as a common acceptor doping step (described below with reference to FIGS. 13 to 15). The implantation amount of donor ions (first conductivity type impurity ions) per unit area in the common donor doping step is lower than the implantation amount of acceptor ions (second conductivity type impurity ions) per unit area in the common acceptor doping step. Through the donor doping step, the n-type emitter layer 13 is formed, and at the same time, counter doping of lowering the net concentration of the p$^+$ anode contact layer 24*b* as compared with the net concentration of the p$^{++}$ base contact layer 14 is performed.

(Details of Configuration)

Hereinafter, details of the present first preferred embodiment will be described although there is a part overlapping with the above-described outline description.

Referring to FIG. 1, each of the IGBT region 10 and the diode region 20 extends from one end side to the other end side of the RC-IGBT 100, and the IGBT region 10 and the diode region 20 are alternately arranged in a stripe shape in a direction orthogonal to the extending direction. In FIG. 1, three IGBT regions 10 and two diode regions are shown, and all the diode regions 20 are sandwiched between the IGBT regions 10. It should be noted that the numbers of the IGBT regions 10 and the diode regions 20 are not limited thereto and are optional. In addition, the arrangement of the IGBT regions 10 and the diode regions 20 in FIG. 1 may be interchanged with each other, and in this case, all the IGBT regions 10 are sandwiched between the diode regions 20. Alternatively, the number of the IGBT regions 10 and the number of the diode regions 20 may be the same, and the IGBT regions 10 and the diode regions 20 may be alternately arranged.

In FIG. 1, a pad region 40 is provided adjacent to the IGBT region 10 on the lower side of the drawing. The control pads 41 may be, for example, a current sense pad 41*a*, a Kelvin emitter pad 41*b*, a gate pads 41*c*, and temperature sense diode pads 41*d* and 41*e*. The current sense pad 41*a* is for detecting a current flowing through a cell region of the RC-IGBT 100. For this purpose, the current sense pad 41*a* is electrically connected to IGBT cells or diode cells in a part of the cell region such that a current of a fraction of to one-several-tens-of-thousandth the current flowing through the entire cell region of the RC-IGBT 100 flows. A gate drive voltage for controlling on/off of the RC-IGBT 100 is applied to the gate pad 41*c*. The Kelvin emitter pad 41*b* is electrically connected to the p-type base layer of the IGBT cell, and the gate pad 41*c* is electrically connected to the gate trench electrode of the IGBT cell. The Kelvin emitter pad 41*b* may be electrically connected to the p-type base layer via a p-type contact layer. The temperature sense diode pads 41*d* and 41*e* are electrically connected to an anode and a cathode of a temperature sense diode provided in the RC-IGBT 100. The temperature of the RC-IGBT 100 is measured by measuring a voltage between an anode and a cathode of a temperature sense diode (not shown) provided in the cell region.

As the withstand voltage holding structure included in the termination region 30, for example, a field limiting ring (FLR) or a variation of lateral doping (VLD) is provided so as to surround the cell region on the upper surface F1 side of the RC-IGBT 100. FLR is composed of a ring-shaped p-type termination well layer, and VLD is composed of a p-type well layer having a concentration gradient. The number of p-type termination well layers in the FLR and the concentration distribution in the VLD may be appropriately selected according to the withstand voltage design of the RC-IGBT 100. It should be noted that the withstand voltage class of the RC-IGBT is not particularly limited. In addition, a p-type termination well layer may be provided over substantially the entire pad region 40, or at least one of an IGBT cell and a diode cell may be provided in the pad region 40.

Referring to FIG. 2, in the IGBT region 10, an active trench gate 11 including an active gate electrode 11*a* and a gate insulating film 11*b*, a dummy trench gate 12 including a dummy gate electrode 12*a* and a dummy trench insulating film 12*b*, an n-type emitter layer 13, and a p$^{++}$ base contact layer 14 are arranged. It should be noted that the dummy trench gate 12 may be omitted. A gate potential is applied to the active gate electrode 11*a* of the active trench gate 11 by being electrically connected to the gate pad 41*c*. The dummy gate electrode 12*a* of the dummy trench gate 12 is electrically connected to the emitter electrode 5 by wiring (not shown), whereby the emitter potential is applied. The dummy gate electrode 12*a* faces the n$^-$ type drift layer 1 via the dummy trench insulating film 12*b*. On the sidewall of the dummy trench gate 12, the n-type emitter layer 13 is not formed, and the p$^{++}$ base contact layer 14 is formed.

In the diode region 20, a diode trench gate 21 including a diode trench electrode 21*a* and a diode trench insulating film 21*b*, a p-type anode layer 25, a p$^{++}$ anode contact layer 24*a*, and a p$^+$ anode contact layer 24*b* are arranged. In the present first preferred embodiment, the p$^{++}$ anode contact layer 24*a* is arranged in a stripe shape while being orthogonal to the diode trench gate 21. In addition, the p$^+$ anode contact layer 24*b* is arranged in a stripe shape so as to be separated from the p-type anode layer 25 by the p$^{++}$ anode contact layer 24*a*. FIG. 2 shows a configuration including one active trench gate 11 and three dummy trench gates 12 disposed adjacent thereto, and although not shown in FIG. 2, the configuration is repeated in the Y direction. It should be noted that in each of the above configurations, the number of active trench gates 11 is an optional number of one or more, and the number of dummy trench gates 12 is an optional number of 0 or more. Therefore, the dummy trench gate 12 may be omitted.

Referring to FIG. 3 (cross section taken along line III-III in FIG. 2), the IGBT region 10 includes an n-type carrier accumulation layer 2 disposed between the n$^-$ drift layer 1 and the upper surface F1, a p-type base layer 15 disposed between the carrier accumulation layer 2 and the upper surface F1, and an n-type emitter layer 13 and a p$^{++}$ base contact layer 14 each disposed between the p-type base layer 15 and the upper surface F1.

The n-type carrier accumulation layer 2 is provided on the upper surface (surface facing the upper surface F1) of the n$^-$ drift layer 1, and has a higher donor concentration than the n$^-$ drift layer 1. The n-type carrier accumulation layer 2 can reduce conduction loss when a current flows through the IGBT region 10. It should be noted that since the n-type carrier accumulation layer 2 and the n$^-$ drift layer 1 are n-type regions in contact with each other, both of them may be regarded as a drift layer. It should be noted that the n$^-$ drift layer 1 may be omitted.

The p-type base layer 15 is disposed between the n-type carrier accumulation layer 2 (n$^-$ drift layer 1 when the n-type carrier accumulation layer 2 is omitted) and the upper surface F1. The p-type base layer 15 is in contact with the gate insulating film 11b of the active trench gate 11.

Each of the n-type emitter layer 13 and the p++ base contact layer 14 is disposed on the p-type base layer 15 and partially forms the upper surface F1. The n-type emitter layer 13 is in contact with the gate insulating film 11b of the active trench gate 11. The p++ base contact layer 14 has a higher acceptor concentration than the p-type base layer 15.

In the present preferred embodiment, the emitter electrode 5 includes an electrode layer 5a and a barrier metal layer 5b between the electrode layer 5a and the upper surface F1 of the semiconductor substrate 50. The material of the barrier metal layer 5b is preferably selected so as to obtain satisfactory ohmic contact with the semiconductor substrate 50, and may be, for example, a conductor containing titanium (Ti), for example, titanium nitride, or TiSi obtained by alloying titanium and silicon (Si). The electrode layer 5a is, for example, an aluminum alloy layer such as an aluminum silicon alloy (Al—Si-based alloy) layer. At least one plating film may be formed on the aluminum alloy layer by an electroless plating method or an electrolytic plating method. The plating film is made of, for example, nickel (Ni). When there is a region which is a fine region between adjacent interlayer insulating films 4 or the like and in which favorable embedding cannot be obtained in the electrode layer 5a, in order to favorably embed the region, a portion made of tungsten being a material having favorable embeddability may be formed, and then a portion made of the above-described material may be formed.

In addition, the IGBT region 10 includes an active trench gate 11 and a dummy trench gate 12 each of which penetrates the n-type emitter layer 13, the p-type base layer 15, and the carrier accumulation layer 2 from the upper surface F1 to reach the n⁻ drift layer 1. The active trench gate 11 and the dummy trench gate 12 are provided in a trench formed in the semiconductor substrate 50. Specifically, the active trench gate 11 includes a gate insulating film 11b formed on the inner wall of the trench, and an active gate electrode 11a formed in the trench via the gate insulating film 11b. When a gate driving voltage is applied to the active gate electrode 11a, a channel is formed in the p-type base layer 15 in contact with the gate insulating film 11b. The dummy trench gate 12 includes a dummy trench insulating film 12b formed on the inner wall of the trench and a dummy gate electrode 12a formed in the trench via the dummy trench insulating film 12b. An interlayer insulating film 4 is provided on the active trench gate 11. The interlayer insulating film 4 is disposed between the active trench gate 11 and the barrier metal layer 5b of the emitter electrode 5 to insulate the active trench gate 11 and the barrier metal layer 5b from each other. The interlayer insulating film 4 on the dummy trench gate 12 may be omitted, and in this case, the dummy gate electrode 12a and the emitter electrode 5 are in contact with each other.

The IGBT region 10 includes an n-type buffer layer 3 disposed between the n⁻ drift layer 1 and the lower surface F2. The n-type buffer layer 3 has a higher donor concentration than the n⁻ drift layer 1. The n-type buffer layer 3 is provided to suppress punch-through of a depletion layer extending from the p-type base layer 15 toward the lower surface F2 when the RC-IGBT 100 is in the off state. It should be noted that the buffer layer 3 may be omitted. It should be noted that since the n-type buffer layer 3 and the n⁻ drift layer 1 are n-type regions in contact with each other, both of them may be regarded as a drift layer.

In addition, the IGBT region 10 includes a p-type collector layer 16 between the n-type buffer layer 3 (the n⁻ drift layer 1 when the n-type buffer layer 3 is omitted) and the lower surface F2. The p-type collector layer 16 partially forms the lower surface F2, and is ohmically connected to the collector electrode 7 by being in contact with the collector electrode 7. The collector electrode 7 may be made of at least one of Al, AlSi, Ni, Ti, and Au. Similarly to the emitter electrode 5, the collector electrode 7 may be made of an aluminum alloy or a laminate of an aluminum alloy and a plating film. The composition of the collector electrode 7 may be different from the composition of the emitter electrode 5.

The n-type emitter layer 13 is provided on both sides in the Y direction (width direction of the active trench gate 11) to be in contact with the gate insulating film 11b. The n-type emitter layer 13 and the p++ base contact layer 14 are alternately arranged in the X direction (extending direction of the active trench gate 11) in FIG. 2. The p++ base contact layer 14 is also provided between two adjacent dummy trench gates 12.

The active gate electrode 11a may be made of, for example, polysilicon doped with phosphorus or the like, or metal. The electrode layer 5a of the emitter electrode 5 may be made of at least any one of Al and AlSi. The barrier metal layer 5b of the emitter electrode 5 is made of Ti, TiN, TiSi, CoSi, or the like, and may include a plug made of W or the like.

In addition, by omitting the barrier metal layer 5b, the electrode layer 5a may be in contact with the semiconductor substrate 50 instead of the barrier metal layer 5b. Alternatively, of the upper surface F1, the barrier metal layer 5b may be provided only on an n-type portion, for example, the n-type emitter layer 13.

Referring to FIG. 3 (cross section taken along line III-III in FIG. 2), the diode region 20 includes a p-type anode layer 25 disposed between the n⁻ drift layer 1 and the upper surface F1, and a p⁺ anode contact layer 24b disposed between the p-type anode layer 25 and the upper surface F1. In addition, the diode region 20 includes diode trench gates 21 each of which penetrates the p-type anode layer 25 and the p⁺ anode contact layer 24b from the upper surface F1 to reach the n⁻ drift layer 1. The diode trench gate 21 is provided in a trench formed in the semiconductor substrate 50. Specifically, the diode trench gate 21 includes a diode trench insulating film 21b formed on the inner wall of the trench, and a diode trench electrode 21a formed in the trench via the diode trench insulating film 21b. Directly disposing the emitter electrode 5 on the diode trench gate 21 applies an emitter potential to the diode trench electrode 21a. As a modified example, the interlayer insulating film 4 may be provided on the diode trench gate 21, and in this case, the diode trench electrode 21a of the diode trench gate 21 is electrically connected to the emitter electrode 5 by wiring (not shown). The diode trench electrode 21a faces the n⁻ type drift layer 1 via the diode trench insulating film 21b.

In addition, the diode region 20 includes an n-type buffer layer 3 disposed between the n⁻ drift layer 1 and the lower surface F2, and an n-type cathode layer 26 disposed between the n-type buffer layer 3 and the lower surface F2. The n-type cathode layer 26 partially forms the lower surface F2 and is in contact with the collector electrode 7. It should be noted that the p-type anode layer 25 may be composed of a structure similar to the laminated structure of the p-type base layer 15 and the carrier accumulation layer 2 in the IGBT region 10. In addition, as described above, omitting the barrier metal layer 5b allows the electrode layer 5a to be in contact with the semiconductor substrate 50 instead of the barrier metal layer 5b.

The donor concentration of the p$^+$ anode contact layer 24b is equal to or higher than the donor concentration of the n$^-$ drift layer 1. The acceptor concentration of the p$^+$ anode contact layer 24b is equal to or higher than the donor concentration of the p$^+$ anode contact layer 24b. Furthermore, the peak value of the acceptor concentration of the p$^+$ anode contact layer 24b is higher than the peak value of the acceptor concentration of the p-type anode layer 25, whereby the net doping concentration of the p$^+$ anode contact layer 24b is higher than the net doping concentration of the p-type anode layer 25.

Referring to FIG. 4 (a cross section taken along line IV-IV in FIG. 2), unlike FIG. 3, in this cross section, a p$^{++}$ anode contact layer 24a is disposed in the diode region 20 instead of the p$^+$ anode contact layer 24b. The net doping concentration of the p$^{++}$ anode contact layer 24a is higher than the net doping concentration of the p$^+$ anode contact layer 24b.

Referring to FIG. 5 (a cross section taken along line V-V in FIG. 2), unlike FIGS. 3 and 4, in this cross section, in the diode region 20, the p$^{++}$ anode contact layer 24a and the p$^+$ anode contact layer 24b are not disposed, and thus the p-type anode layer 25 is in contact with the barrier metal layer 5b of the emitter electrode 5.

Referring to FIG. 2, between two adjacent diode trench gates 21, the anode contact region 24 and the p-type anode layer 25 are alternately arranged in the X direction (extending direction of the diode trench gate 21). In addition, in the present first preferred embodiment, in the X direction, the p$^{++}$ anode contact layer 24a is disposed between the p-type anode layer 25 and the p$^+$ anode contact layer 24b.

Although the IGBT region 10 and the diode region 20 are in contact with each other in the present preferred embodiment, another region may be interposed therebetween. In any case, the IGBT region 10 and the diode region 20 share one semiconductor substrate 50. In the former case, the end of the p-type collector layer 16 may be positioned at the boundary between the IGBT region 10 and the diode region 20, or may protrude into the diode region 20 by the distance U1 (FIGS. 3 to 5). When U1>0, since the distance between the n-type cathode layer 26 and the active trench gate 11 can be increased, even when a gate driving voltage is applied to the active gate electrode 11a during the freewheeling diode operation of the RC-IGBT 100, a current from a channel formed adjacent to the active trench gate 11 of the IGBT region 10 to the n-type cathode layer 26 can be suppressed. For this purpose, the distance U1 is preferably, for example, about 100 μm. However, depending on the application of the RC-IGBT, the distance U1 may be preferably 0 μm or more and less than 100 μm. In addition, as a modified example, implanting acceptors into the lower surface F2 may set a part of the region where the n-type cathode layer 26 is disposed in FIGS. 3 to 5 to a p-type region.

The donor of the n$^-$ drift layer 1 may be arsenic or phosphorus, and the donor concentration of the n$^-$ drift layer 1 is, for example, $1\times10^{12}/cm^3$ or more and $1\times10^{15}/cm^3$ or less. The donor of the n-type emitter layer 13 may be arsenic or phosphorus, and the donor concentration of the n-type emitter layer 13 is, for example, $1\times10^{17}/cm^3$ or more and $1\times10^{20}/cm^3$ or less. The donor of the n-type carrier accumulation layer 2 may be arsenic or phosphorus, and the donor concentration of the n-type carrier accumulation layer 2 is, for example, $1\times10^{13}/cm^3$ or more and $1\times10^{17}/cm^3$ or less. The donor of the n-type buffer layer 3 may be at least any one of phosphorus (P) and proton (H$^+$), and the donor concentration of the n-type buffer layer 3 is, for example, $1\times10^{12}/cm^3$ or more and $1\times10^{18}/cm^3$ or less. The donor of the n-type cathode layer 26 may be arsenic or phosphorus, and the donor concentration of the n-type cathode layer 26 is, for example, $1\times10^{16}/cm^3$ or more and $1\times10^{21}/cm^3$ or less.

The acceptor of the p-type anode contact region 24 may be boron or aluminum, and the acceptor concentration of the p-type anode contact region 24 is, for example, $1\times10^{15}/cm^3$ or more and $1\times10^{20}/cm^3$ or less. The acceptor of the p$^{++}$ base contact layer 14 may be boron or aluminum, and the acceptor concentration of the p$^{++}$ base contact layer 14 is, for example, $1\times10^{15}/cm^3$ or more and $1\times10^{20}/cm^3$ or less. The donor of the p-type base layer 15 may be boron or aluminum, and the donor concentration of the p-type base layer 15 is, for example, $1\times10^{12}/cm^3$ or more and $1\times10^{19}/cm^3$ or less. The acceptor of the p-type collector layer 16 may be boron or aluminum, and the acceptor concentration of the p-type collector layer 16 is, for example, $1\times10^{16}/cm^3$ or more and $1\times10^{20}/cm^3$ or less. The acceptor of the p-type anode layer 25 may be boron or aluminum, and the acceptor concentration of the p-type anode layer 25 is, for example, $1\times10^{12}/cm^3$ or more and $1\times10^{19}/cm^3$ or less.

Figure 6:
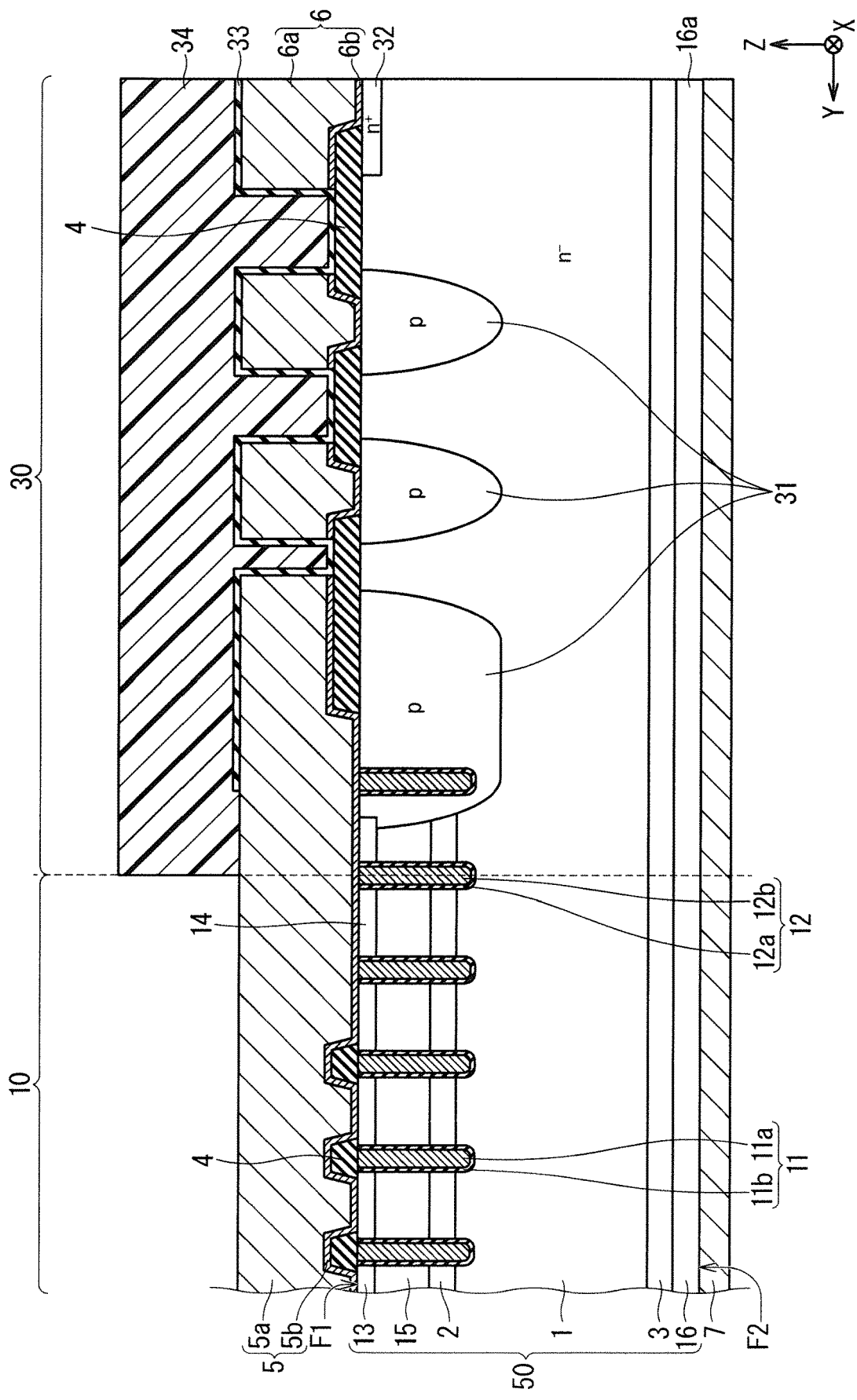
FIG. 6 is a partial cross-sectional view taken along line VI-VI in FIG. 1.
Figure 7:
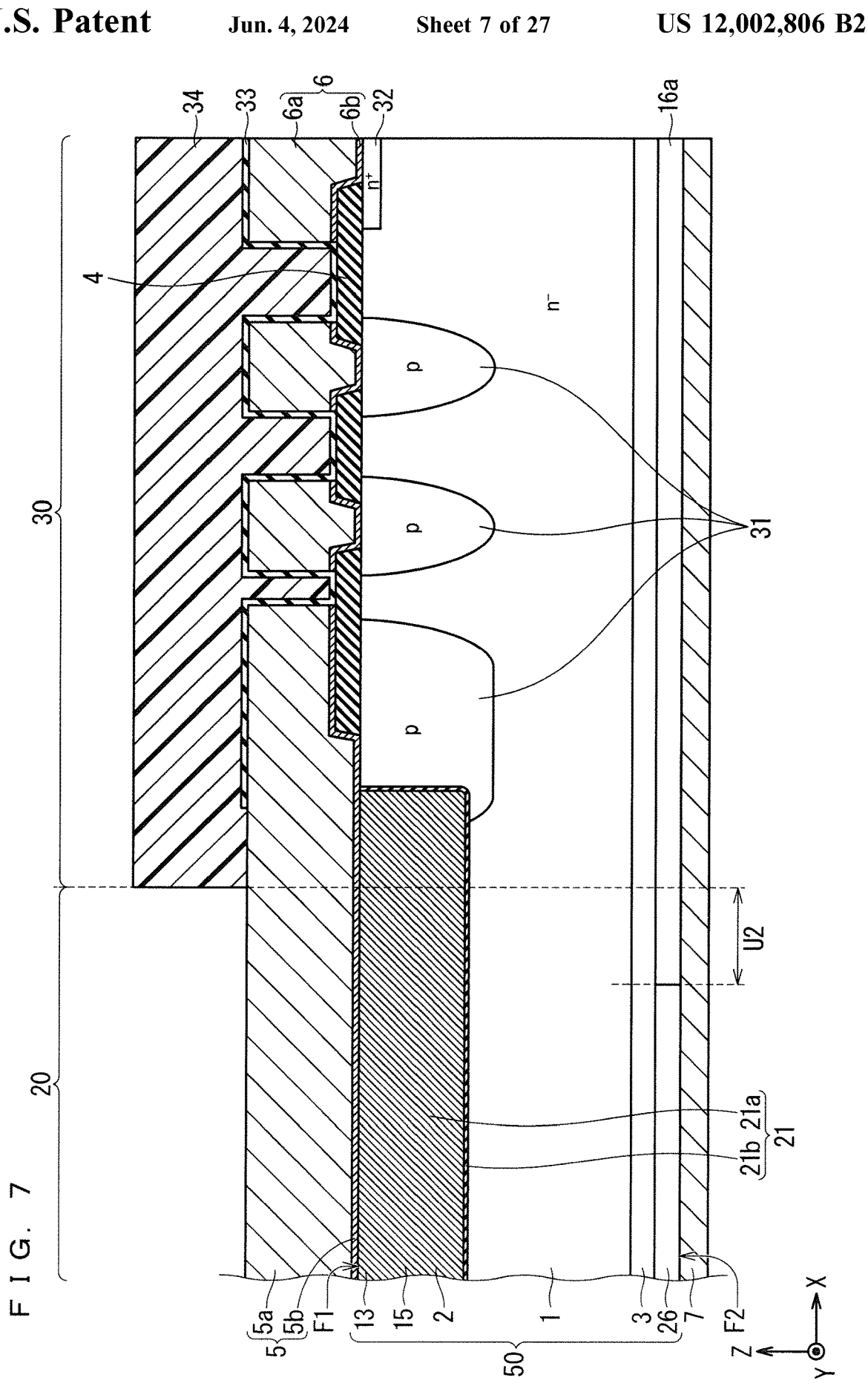
FIG. 7 is a partial cross-sectional view taken along line VII-VII in FIG. 1.

Next, a configuration of termination region 30 will be described below. FIGS. 6 and 7 are respectively schematic cross-sectional views taken along lines VI-VI and VII-VII in FIG. 1.

As described above, each of the upper surface F1 and the lower surface F2 extends not only over the IGBT region 10 and the diode region 20 but also over the termination region 30. In other words, each of the upper surface F1 and the lower surface F2 continuously extends between the IGBT region 10, the diode region 20, and the termination region 30. In addition, as described above, the n$^-$ drift layer 1 extends not only over the IGBT region 10 and the diode region 20 but also over the termination region 30. In other words, the n$^-$ drift layer 1 continuously extends between the IGBT region 10, the diode region 20, and the termination region 30.

In the termination region 30, a plurality of p-type termination well layers 31 and an n$^+$ type channel stopper layer 32 are provided on a surface of the n$^-$ drift layer 1 facing the upper surface F1. The acceptor of the p-type termination well layer 31 may be boron or aluminum, and the acceptor concentration of the p-type termination well layer 31 is, for example, $1\times10^{14}/cm^3$ or more and $1\times10^{19}/cm^3$ or less. The p-type termination well layer 31 surrounds a cell region including the IGBT region 10 and the diode region 20. The p-type termination well layer 31 is provided as a plurality of ring patterns, and the number thereof is appropriately selected according to the withstand voltage design of the RC-IGBT 100. The n$^+$-type channel stopper layer 32 surrounds the p-type termination well layer 31.

A p-type termination collector layer 16a is provided between the n$^-$ drift layer 1 and the lower surface F2 of the semiconductor substrate 50. The p-type termination collector layer 16a is formed integrally and continuously with the p-type collector layer 16 provided in the cell region. Therefore, the p-type termination collector layer 16a and the p-type collector layer 16 may be collectively referred to as a collector layer. The p-type termination collector layer 16a may protrude into the diode region 20 by a distance U2. When the diode region 20 is adjacent to the termination region 30 as shown in FIG. 1, satisfying U2>0 increases the distance between the n-type cathode layer 26 of the diode region 20 and the p-type termination well layer 31. This makes it possible to prevent the p-type termination well layer 31 from operating as an anode of a diode. The distance U2 is, for example, about 100 μm.

As described above, the collector electrode 7 extends not only over the IGBT region 10 and the diode region 20 but also over the termination region 30. In other words, the collector electrode 7 continuously extends between the IGBT region 10, the diode region 20, and the termination region 30.

As described above, the emitter electrode 5 extends not only over the IGBT region 10 and the diode region 20 but also over a part of the termination region 30. In other words, the emitter electrode 5 continuously extends between the IGBT region 10, the diode region 20, and a part of the termination region 30. On the upper surface F1 of the semiconductor substrate 50, the termination region 30 includes a termination electrode 6 separated from the emitter electrode 5. Similarly to the emitter electrode 5 including the electrode layer 5a and the barrier metal layer 5b, the terminal electrode 6 may include the electrode layer 6a and the barrier metal layer 6b. The terminal electrode 6 is electrically connected to each of the p-type terminal well layer 31 and the n$^+$-type channel stopper layer 32 via a contact hole formed in the interlayer insulating film 4 on the upper surface F1. The emitter electrode 5 and the terminal electrode 6 are electrically connected to each other via the semi-insulating film 33. The semi-insulating film 33 may be, for example, a semi-insulating silicon nitride (sinSiN) film.

The termination region 30 is provided with a termination protection film 34 that covers the emitter electrode 5, the termination electrode 6, and the semi-insulating film 33. The termination protection film 34 is made of, for example, polyimide.

(Details of Manufacturing Method)

Figure 8:
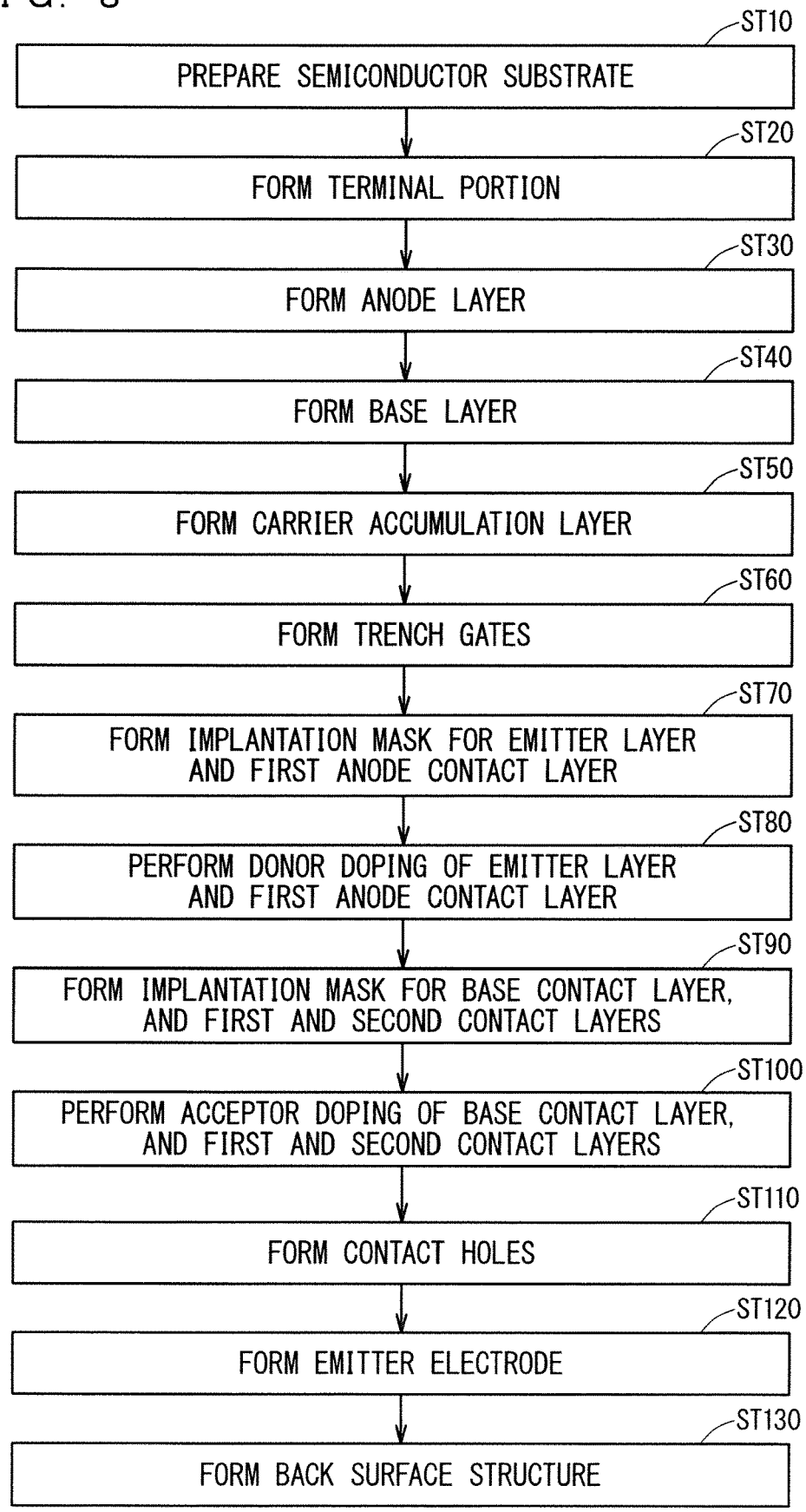
FIG. 8 is a flowchart schematically showing a method for manufacturing the reverse conducting semiconductor device in FIG. 1.
Figure 13:
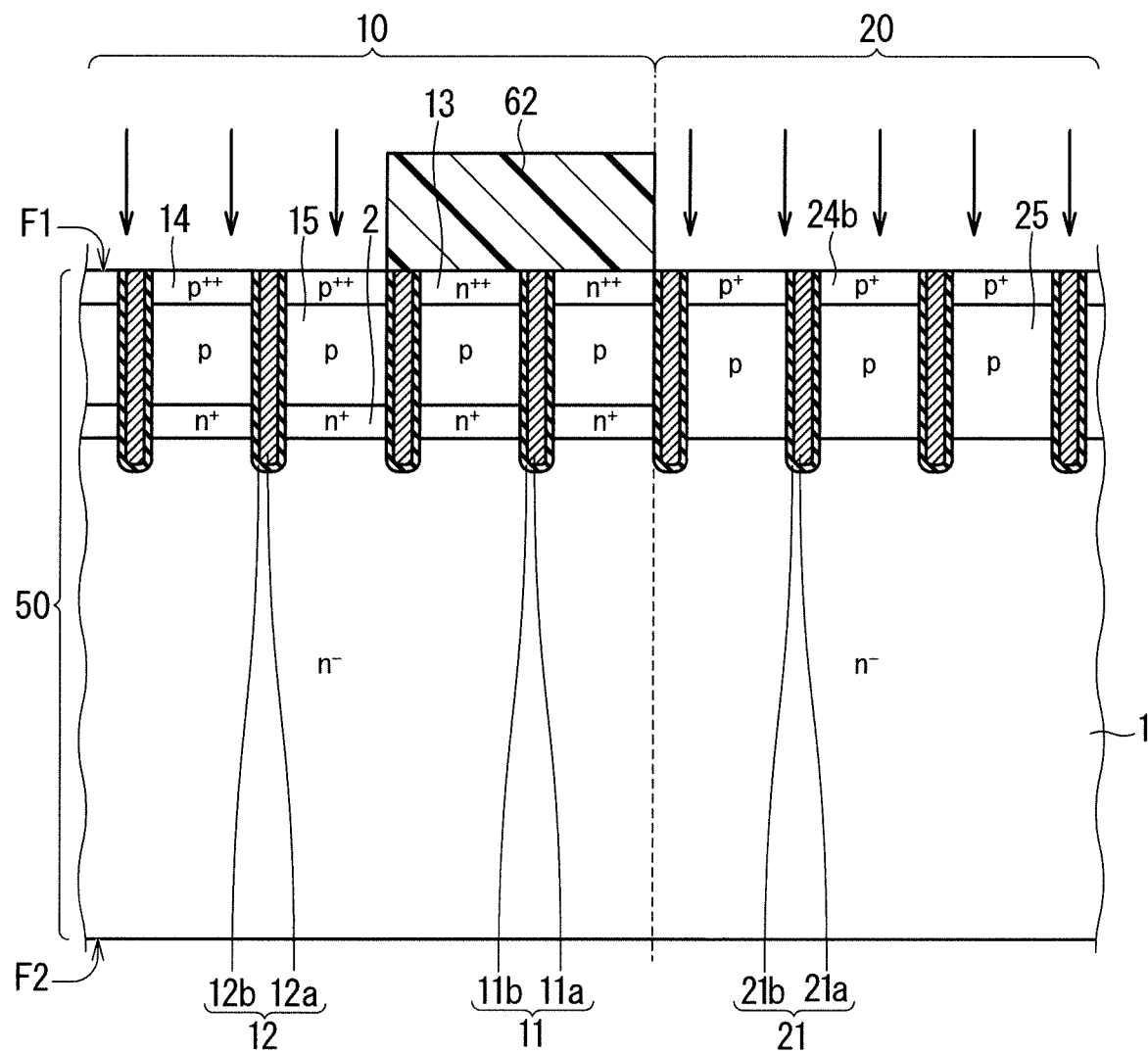
FIG. 13 is a partial cross-sectional view schematically showing one step in the manufacturing method in FIG. 8, corresponding to a cross section taken along line III-III in FIG. 2.
Figure 14:
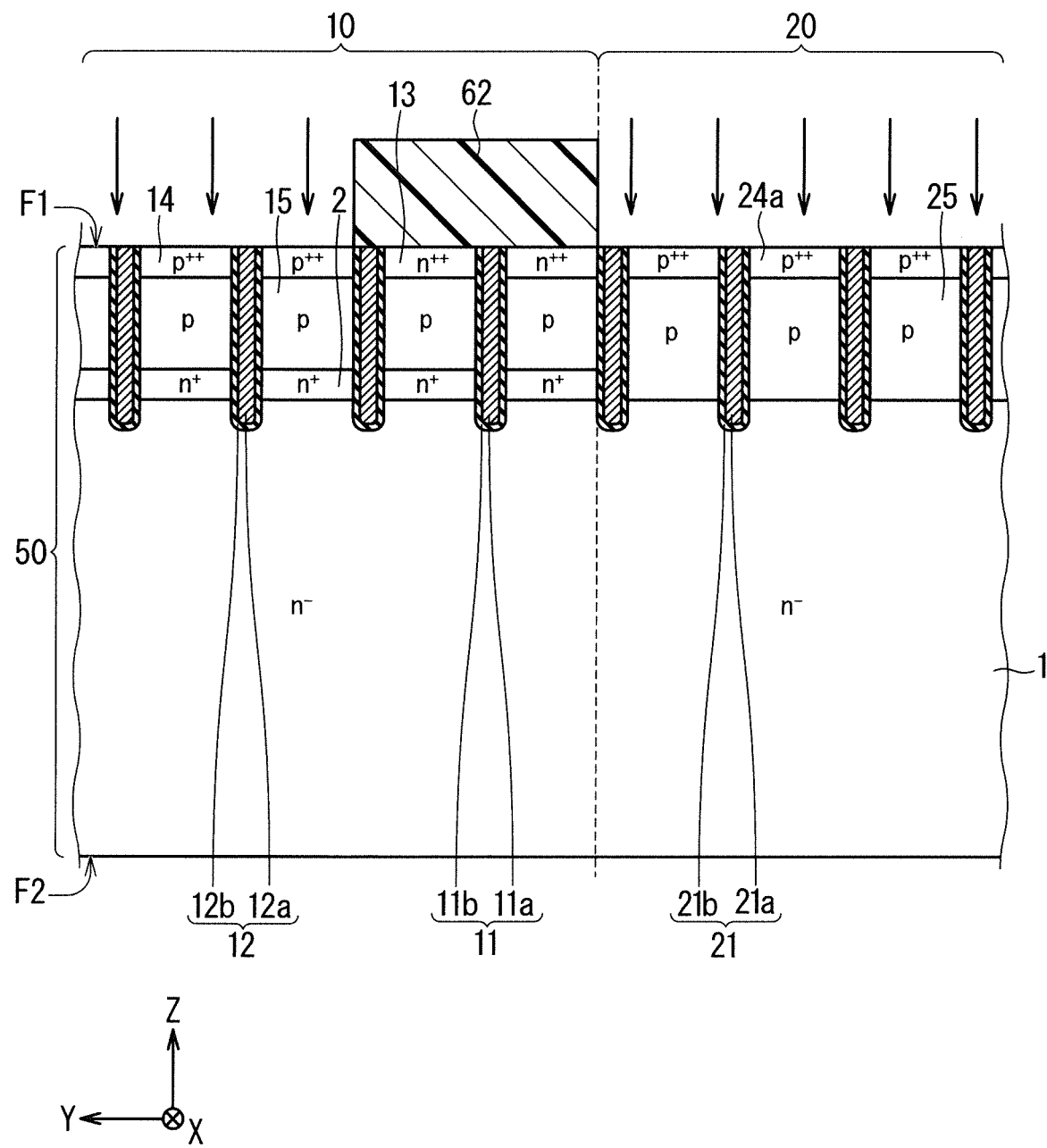
FIG. 14 is a partial cross-sectional view schematically showing the step in FIG. 13 corresponding to a cross section taken along line IV-IV in FIG. 2.
Figure 15:
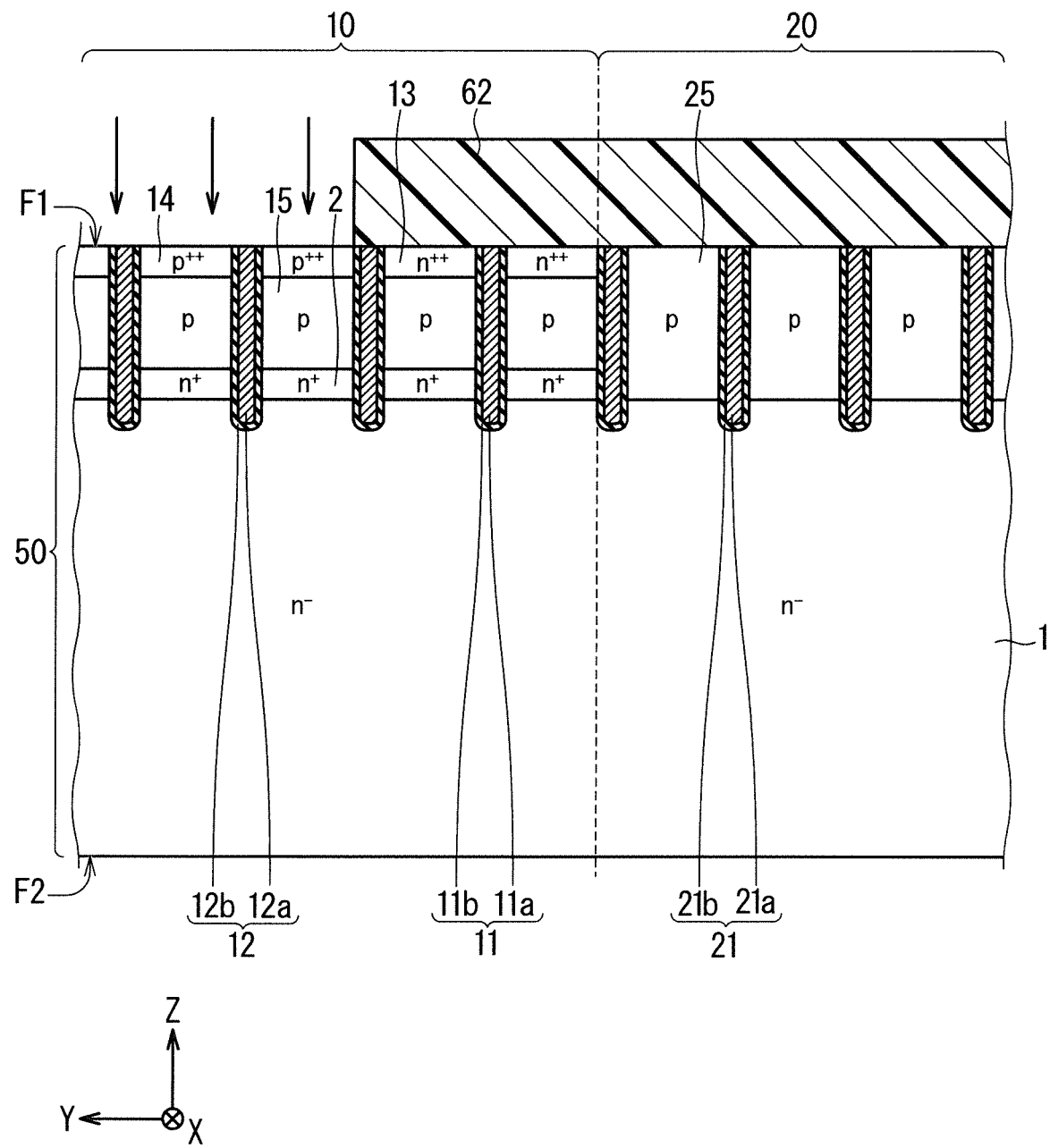
FIG. 15 is a partial cross-sectional view schematically showing the step in FIG. 13 corresponding to a cross section taken along line V-V in FIG. 2.

FIG. 8 is a flowchart schematically showing a method for manufacturing the RC-IGBT 100. FIGS. 9 to 15 are partial cross-sectional views schematically showing one step in the manufacturing method in FIG. 8. It should be noted that the cross section in FIG. 9 corresponds to cross sections common to line III-III, line IV-IV, and line V-V in FIG. 2. The cross section in FIG. 10 also corresponds to the cross sections common to the line III-III, the line IV-IV, and the line V-V in FIG. 2. FIGS. 11 and 12 show the same one step, the cross section in FIG. 11 corresponds to the cross section of line III-III in FIG. 2, and the cross section in FIG. 12 corresponds to the cross sections common to lines IV-IV and V-V in FIG. 2. FIGS. 13 to 15 show the same one step, and the respective cross sections in FIGS. 11 to 15 correspond to the cross sections of lines III-III IV-IV, and V-V in FIG. 2.

Figure 9:
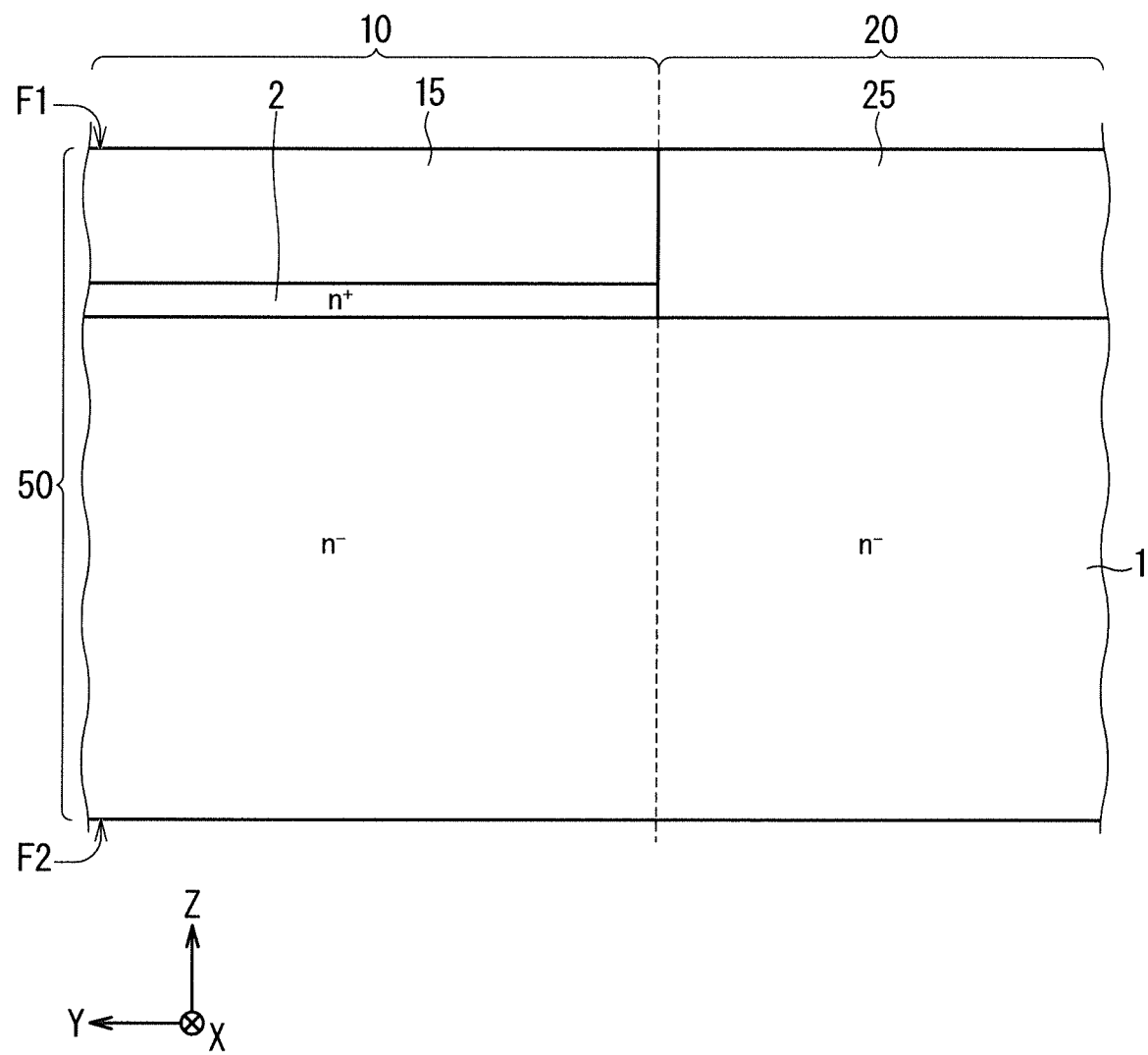
FIG. 9 is a partial cross-sectional view schematically showing one step in the manufacturing method in FIG. 8 corresponding to a cross section common to lines IV-IV, and V-V in FIG. 2.

Referring to FIG. 9, the semiconductor substrate 50 is prepared in step ST10 (FIG. 8). The semiconductor substrate 50 to be prepared is, for example, a wafer manufactured by a floating zone (FZ) method, that is, an FZ wafer, a wafer manufactured by a magnetic applied CZochralki (MCZ) method, that is, an MCZ wafer, or an epitaxial wafer. The semiconductor substrate 50 to be prepared includes a portion that serves as the n$^-$ drift layer 1 as it is, in the completed RC-IGBT 100, and the whole thereof has n-type conductivity. The donor concentration of the n$^-$ drift layer 1 is appropriately selected according to the withstand voltage of the RC-IGBT 100, and for example, when the withstand voltage is 1200 V, the specific resistance of the n$^-$ drift layer 1 is adjusted to about 40 to 120 Ω·cm. Performing ion implantation and subsequent heat treatment on the semiconductor substrate 50 thus prepared forms a desired layer (region) in the semiconductor substrate 50. In the heat treatment, the implanted ions are diffused and activated. Although the description of the heat treatment is omitted below, the heat treatment may be performed at an appropriate timing. The order of the ion implantation step may be replaced. In addition, the order of other steps may also be replaced within the scope of no hindrance.

In step ST20, the termination region 30 (FIGS. 6 and 7) is formed by a well-known manufacturing method. For example, in order to form FLR including the p-type termination well layer 51 as a withstand voltage holding structure of the termination region 30, acceptor ions are doped by ion implantation. It should be noted that part or all of the ion implantation for forming the termination region 30 may be performed simultaneously when the ion implantation is performed on the IGBT region 10 and the diode region 20 as described below.

In steps ST30 and ST40 (FIG. 8), implanting acceptors such as boron (B) from the upper surface F1 side of the semiconductor substrate 50 forms the p-type base layer 15 and the p-type anode layer 25. Since mask processing is performed on the upper surface F1 of the semiconductor substrate 50, and then the donor and acceptor are added by ion implantation, the donor and acceptor are selectively formed on the upper surface F1 of the semiconductor substrate 50. It should be noted that the mask processing refers to processing of forming a mask by applying a resist on the semiconductor substrate 50 and forming an opening in a predetermined region of the resist using a photoengraving technique. Using this mask makes it possible to perform processing such as ion implantation or etching on a specific region of the semiconductor substrate 50. The p-type anode layer 25 and the p-type base layer 15 are formed by simultaneously or individually performing ion implantation of an acceptor. When they are formed individually, each composition can be adjusted independently. The p-type termination well layer 51 (FIGS. 6 and 7) may be simultaneously formed by ion implantation of an acceptor for forming the p-type anode layer 25. When they are formed individually, each composition can be adjusted independently. In addition, the p-type termination well layer 51, the p-type base layer 15, and the p-type anode layer 25 may be formed simultaneously.

In step ST50 (FIG. 8), the n-type carrier accumulation layer 2 is formed by implanting donors such as phosphorus (P) from the upper surface F1 side of the semiconductor substrate 50.

Figure 10:
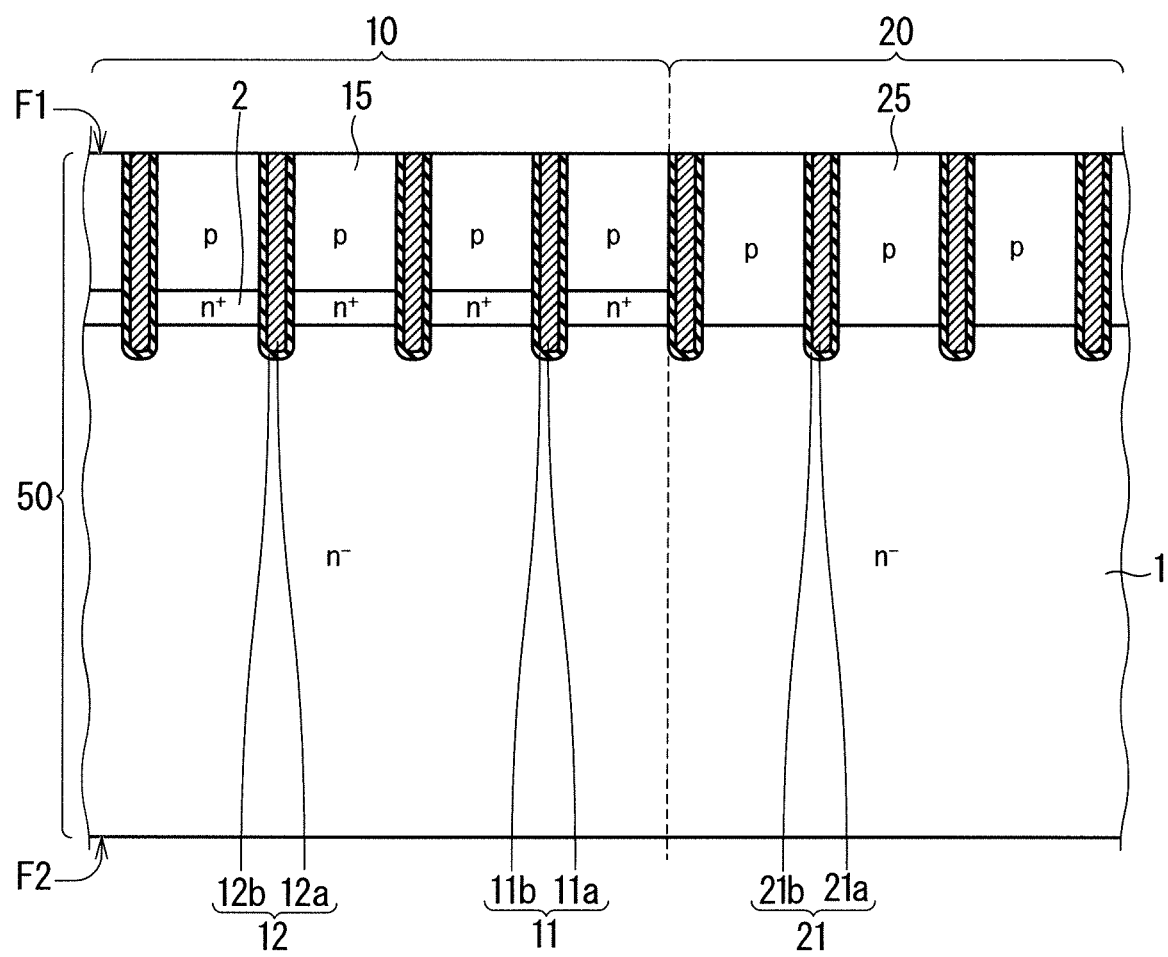
FIG. 10 is a partial cross-sectional view schematically showing one step in the manufacturing method in FIG. 8 corresponding to a cross section common to lines III-III, IV-IV, and V-V in FIG. 2.
Figure 10:
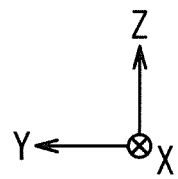

Referring to FIG. 10, in step ST60 (FIG. 8), the active trench gate 11, the dummy trench gate 12, and the diode trench gate 21 are formed. Specifically, first, trenches for these are formed by etching. The etching may be performed using, for example, a mask composed of an oxide film (for example, a SiO$_2$ film) having an opening. It should be noted that in FIG. 10, the pitches of the trenches are equal, but the pitches of the trenches may be unequal. Next, heating the semiconductor substrate 50 in an atmosphere containing oxygen oxidizes the inner walls of the trenches. Thus, the gate insulating film 11b, the dummy trench insulating film 12b, and the diode trench insulating film 21b are simultaneously formed. Of the surface of the semiconductor substrate 50, a portion unnecessarily oxidized by the oxidation is removed in a later step. Next, depositing doped polysilicon in the trench by chemical vapor deposition (CVD) or the like forms the active gate electrode 11a, the dummy gate electrode 12a, and the diode trench electrode 21a.

Figure 11:
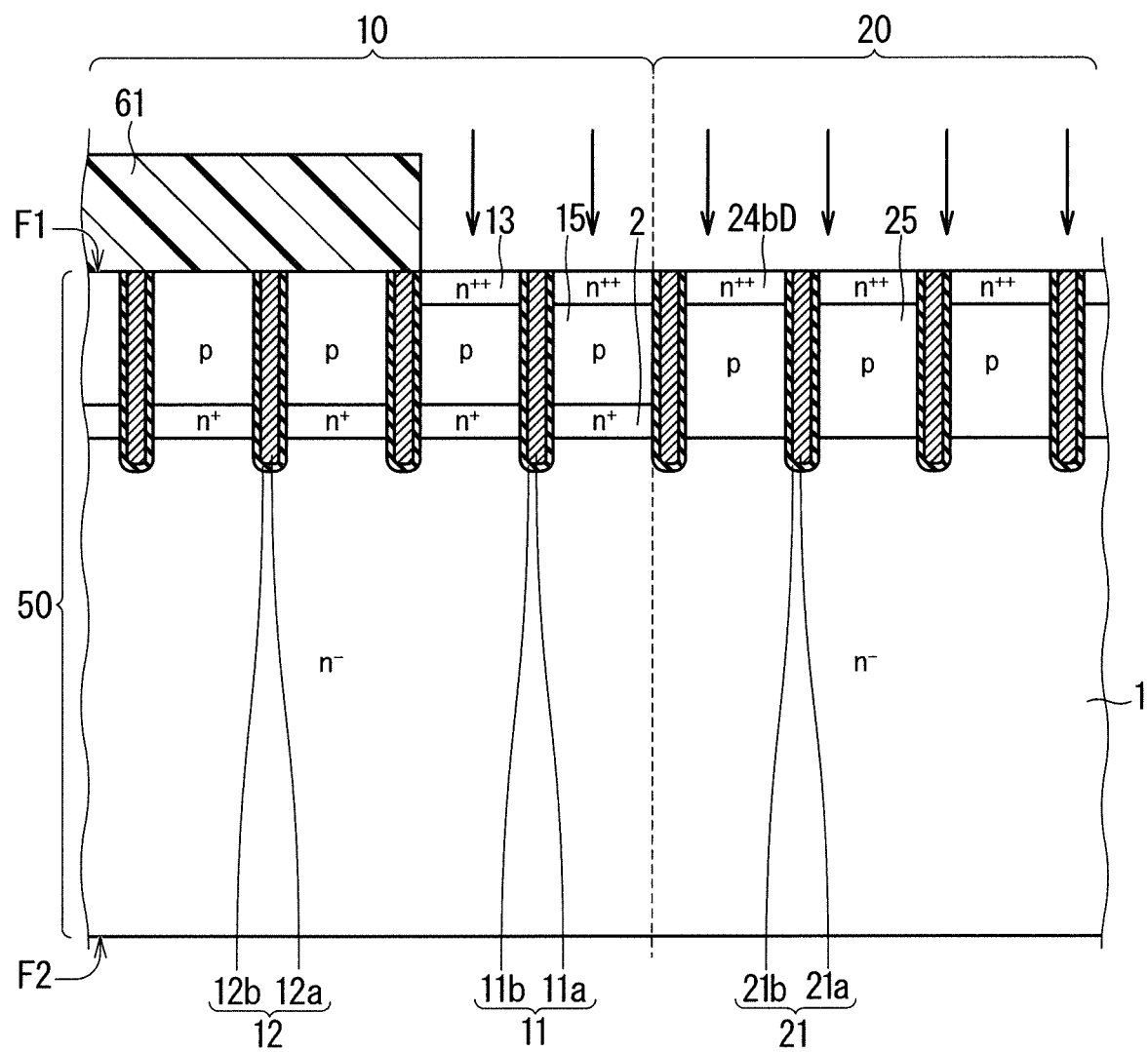
FIG. 11 is a partial cross-sectional view schematically showing one step in the manufacturing method in FIG. 8, corresponding to a cross section taken along line III-III in FIG. 2.
Figure 12:
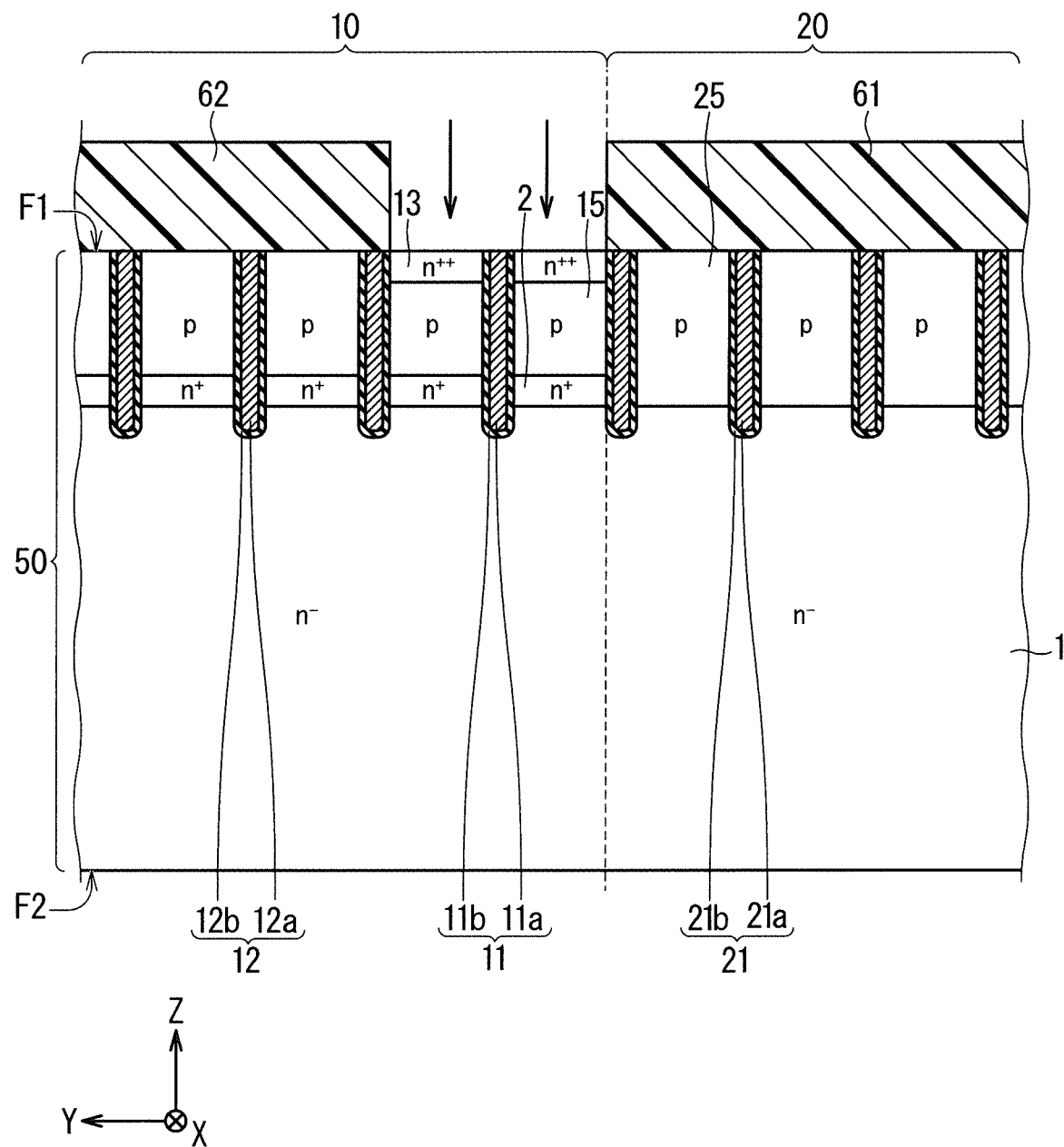
FIG. 12 is a partial cross-sectional view schematically showing the step in FIG. 11 corresponding to a cross section common to lines IV-IV and V-V in FIG. 2.

Referring to FIG. 11 (corresponding to the cross section taken along line III-III in FIG. 2) and FIG. 12 (corresponding to the cross sections taken along lines IV-IV and V-V in FIG. 2), in step ST70 (FIG. 8), an implantation mask 61 for the n-type emitter layer 13 and the p$^+$ anode contact layer 24b (first anode contact layer) is formed. The implantation mask 61 has an opening that exposes a region where the n-type emitter layer 13 and the p$^+$ anode contact layer 24b (see FIG. 3) are to be formed. In step ST80 (FIG. 8), ion implantation onto the upper surface F1 of the semiconductor substrate 50 using the implantation mask 61 simultaneously performs a step of performing donor doping of the n-type emitter layer 13 and a step of performing donor doping of the $p^+$ anode contact layer 24$b$ (see FIG. 3) as a common donor doping step. In FIG. 11, a region serving as the $p^+$ anode contact layer 24$b$ (see FIG. 3) is a provisional region 24$b$D having n-type conductivity instead of p-type conductivity. Similarly to the n-type emitter layer 13, the provisional region 24$b$D has n-type conductivity by donors being doped. Thereafter, the implantation mask 61 is removed.

Referring to FIG. 13 (corresponding to the cross section taken along line III-III in FIG. 2), FIG. 14 (corresponding to the cross sections taken along lines IV-IV and V-V in FIG. 2), and FIG. 15 (corresponding to the cross section taken along line V-V in FIG. 2), in step ST90 (FIG. 8), an implantation mask 62 for the $p^{++}$ base contact layer 14, the $p^+$ anode contact layer 24$b$ (first anode contact layer), and the $p^{++}$ anode contact layer 24$a$ (second anode contact layer) is formed. The implantation mask 62 has an opening that exposes a region where the $p^{++}$ base contact layer 14, the $p^+$ anode contact layer 24$b$, and the $p^{++}$ anode contact layer 24$a$ are to be formed. In step ST100 (FIG. 8), ion implantation onto the upper surface F1 of the semiconductor substrate 50 using the implantation mask 62 performs a step of performing acceptor doping of the $p^{++}$ base contact layer 14, a step of performing acceptor doping of the $p^+$ anode contact layer 24$b$ (FIG. 3), and a step of performing acceptor doping of the $p^{++}$ anode contact layer 24$a$ as a common acceptor doping step. The step of performing acceptor doping of the $p^+$ anode contact layer 24$b$ (FIG. 3) causes the provisional region 24$b$D (FIG. 11) having n-type conductivity to become the $p^+$ anode contact layer 24$b$ having p-type conductivity. In order to enable the conductivity type to be reversed in this manner, the implantation amount of donor ions per unit area in the common donor doping step (FIGS. 13 to 15) is lower than the implantation amount of acceptor ions per unit area in the common acceptor doping step (FIGS. 11 and 12). Thereafter, the implantation mask 62 is removed.

It should be noted that as described above, the order of the ion implantation step may be replaced. Therefore, the order of the donor doping step (FIGS. 13 to 15) and the acceptor doping step (FIGS. 11 and 12) may be replaced. In this case, a p-type region having a high net concentration similarly to the $p^{++}$ base contact layer 14 is formed in a region to be the $p^+$ anode contact layer 24$b$, instead of the provisional region 24$b$D (FIG. 11) having n-type conductivity, at a time point between both doping steps.

In step ST110 (FIG. 8), the interlayer insulating film 4 (see FIGS. 3 to 5) made of, for example, $SiO_2$ is formed. Then, a contact hole is formed in the interlayer insulating film 4. This contact hole is formed on each of the n-type emitter layer 13, the $p^{++}$ base contact layer 14, the $p^+$ anode contact layer 24$b$, the $p^{++}$ anode contact layer 24$a$, the dummy gate electrode 12$a$, and the diode trench electrode 21$a$.

In step ST120 (FIG. 8), a barrier metal layer 5$b$ and an electrode layer 5$a$ are formed as the emitter electrode 5 (see FIGS. 3 to 5). The barrier metal layer 5$b$ is formed by depositing titanium nitride by physical vapor deposition (PVD) or CVD. As the electrode layer 5$a$, for example, an aluminum alloy layer such as an aluminum silicon alloy (Al—Si-based alloy) layer is formed by PVD such as sputtering or vapor deposition. At least one plating film may be formed on the aluminum alloy layer by an electroless plating method or an electrolytic plating method. The plating film is made of, for example, nickel (Ni) or an alloy thereof. Forming at least a part of the electrode layer 5$a$ by a plating method allows the thickness of the electrode layer 5$a$ to be easily secured. Increasing the thickness of the electrode layer 5$a$ increases the heat capacity, thereby improving the heat resistance of the electrode layer 5$a$.

In step ST130 (FIG. 8), a back surface structure is formed. The back surface structure is formed, for example, as follows.

First, grinding the lower surface F2 of the semiconductor substrate 50 reduces the thickness of the semiconductor substrate 50 to a predetermined design thickness. The design thickness is, for example, 80 μm to 200 μm.

Next, implanting donors into the lower surface F2 of the semiconductor substrate 50 forms the n-type buffer layer 3. The n-type buffer layer 3 may be formed in the IGBT region 10, the diode region 20, and the termination region 30. Alternatively, the n-type buffer layer 3 may be formed only in the IGBT region 10 or the diode region 20. The donor implantation may be performed, for example, by at least any one of phosphorus (P) ion implantation and proton ($H^+$) implantation. Protons can be implanted from the lower surface F2 of the semiconductor substrate 50 to a deep position with relatively low acceleration energy. In addition, changing the acceleration energy allows the depth of proton implantation to be relatively easily changed. Therefore, when the n-type buffer layer 3 is to be formed with proton, as compared with when the n-type buffer layer 3 is to be formed with phosphorus, performing ion implantation a plurality of times while changing the acceleration energy makes it easy to sufficiently secure the dimension of the n-type buffer layer 3 in the thickness direction (Z direction) of the semiconductor substrate 50. On the other hand, phosphorus has a higher activation rate as a donor than proton. Therefore, forming the n-type buffer layer 3 with phosphorus allows an effect of more reliably suppressing punch-through of the depletion layer to be obtained even with the thin semiconductor substrate 50. In order to further enhance the effect, it is preferable to form the n-type buffer layer 3 by implanting both protons and phosphorus, and in this case, protons are implanted at a position deeper from the lower surface F2 than phosphorus.

In addition, implanting acceptors into the lower surface F2 of the semiconductor substrate 50 forms the p-type collector layer 16. Acceptor implantation is performed, for example, by boron (B) implantation. When the p-type collector layer 16 is formed, the p-type termination collector layer 16$a$ (see FIGS. 6 and 7) may be formed at the same time in the termination region 30.

Next, the n-type cathode layer 26 (see FIGS. 3 to 5) is formed in the diode region 20, for example, by phosphorus (P) implantation. The implantation amount of the donors for forming the n-type cathode layer 26 is larger than the implantation amount of the acceptors for forming the p-type collector layer 16. It should be noted that in FIGS. 3 to 5, the depths of the p-type collector layer 16 and the n-type cathode layer 26 from the lower surface F2 are shown to be the same, but the depth of the n-type cathode layer 26 is preferably equal to or more than the depth of the p-type collector layer 16. Since acceptors are also implanted into the region where the n-type cathode layer 26 is to be formed, more donors are implanted than the amount that offsets the acceptors.

The ions implanted into the lower surface F2 side of the semiconductor substrate 50 may be activated by laser annealing of irradiating the lower surface F2 with a laser beam. Laser annealing allows not only the p-type collector layer 16 but also the n-type buffer layer 3 positioned relatively shallow from the lower surface F2 to be activated at the same time. When protons are used for the n-type buffer layer 3, the heat treatment temperature suitable for the activation is relatively low, about 380° C. to 450° C. Therefore, it is necessary to be careful not to make the temperature of the region where the protons are implanted higher than about 380° C. to 450° C. Since the laser annealing can heat the vicinity of the lower surface F2 of the semiconductor substrate 50 to a high temperature, even after implanting protons into the n-type buffer layer 3 separated from the lower surface F2, appropriately adjusting the laser irradiation conditions allows the vicinity of the lower surface F2 to be heated to a high temperature while not exceeding the above temperature range.

Next, the collector electrode 7 (FIGS. 3 to 5) is formed on the lower surface F2 of the semiconductor substrate 50. The collector electrode 7 is formed to extend over the IGBT region 10, the diode region 20, and the termination region 30 on the lower surface F2. The collector electrode 7 may be formed on the entire lower surface F2. As the collector electrode 7, for example, PVD such as sputtering or vapor deposition forms an aluminum alloy layer such as an aluminum silicon alloy (Al—Si-based alloy) layer, or a titanium (Ti) layer. For example, a laminated structure may be provided by these layers and a nickel (Ni) layer or a gold (Au) layer. In addition, at least one plating film may be formed on the metal film formed by PVD by an electroless plating method or an electrolytic plating method.

It should be noted that step ST130 may be performed at a timing between the formation of the aluminum alloy layer and the formation of at least one plating film in the above description in relation to step ST120.

With the above, the RC-IGBT 100 is manufactured. It should be noted that in mass production, at the time point when the wafer-level step is completed, a plurality of RC-IGBTs 100 arranged in a matrix shape is formed on one wafer. These are cut into individual RC-IGBTs 100 by laser dicing or blade dicing.

(Effect)

According to the present first preferred embodiment, first, the p$^+$ anode contact layer 24b of the diode region 20 has a lower net concentration than the p$^{++}$ base contact layer 14 of the IGBT region 10. This net concentration difference can achieve high latch-up tolerance in the IGBT region 10 and low recovery loss in the diode region 20. Second, the p$^+$ anode contact layer 24b has a higher donor concentration than the p$^{++}$ base contact layer 14. Utilizing this high donor concentration allows the process of adjusting the acceptor concentration to be simplified in order to avoid a significant increase in manufacturing cost when obtaining the net concentration difference described above. From the above, it is possible to achieve high latch-up tolerance and low recovery loss while avoiding a significant increase in manufacturing cost.

Specifically, the step of performing donor doping of the n-type emitter layer 13 and the step of performing donor doping of the p$^+$ anode contact layer 24b are simultaneously performed as the common donor doping step (FIGS. 11 and 12). Thus, the manufacturing method is simplified as compared with the case where the step of performing donor doping of the n-type emitter layer 13 and the step of performing donor doping of the p$^+$ anode contact layer 24b are individually performed. Therefore, the manufacturing cost can be reduced.

In addition, a step of performing acceptor doping of the p$^{++}$ base contact layer 14 and a step of performing acceptor doping of the p$^+$ anode contact layer 24b are simultaneously performed as a common acceptor doping step (FIGS. 13 to 15). Thus, the manufacturing method is simplified as compared with the case where the step of performing acceptor doping of the p$^{++}$ base contact layer 14 and the step of performing acceptor doping of the p$^+$ anode contact layer 24b are individually performed. Therefore, the manufacturing cost can be reduced.

The implantation amount of donor ions per unit area in the above-described common donor doping step is lower than the implantation amount of acceptor ions per unit area in the above-described common acceptor doping step. Thus, p-type conductivity can be assigned to the p+ anode contact layer 24b by a combination of the common donor doping step and the common acceptor doping step.

The p$^+$ anode contact layer 24b has a lower net concentration than the p$^{++}$ anode contact layer 24a. Thus, adjusting the arrangement of the p$^{++}$ anode contact layer 24a and the p$^+$ anode contact layer 24b in the diode region 20 allows the recovery loss of the diode region 20 to be further reduced.

The p$^+$ anode contact layer 24b has a higher donor concentration than the p$^{++}$ anode contact layer 24a. Thus, the difference in net concentration of the p$^+$ anode contact layer 24b from the net concentration of the p$^{++}$ anode contact layer 24a can be adjusted by the difference in donor concentration.

The upper surface F1 has no n-type conductivity in the diode region 20. Thus, it is possible to suppress a decrease in a reverse recovery safe operating area (RRSOA) due to the formation of the parasitic npn transistor.

The p-type anode layer 25 forms a part of the upper surface F1. Thus, the hole injection efficiency is reduced. Therefore, the recovery loss of the diode region 20 can be reduced.

The net peak concentration of the p-type anode layer 25 is $1\times10^{16}$/cm$^3$ or more. Thus, it is possible to suppress a decrease in the RRSOA.

The net peak concentration of the p$^+$ anode contact layer 24b is $1\times10^{18}$/cm$^3$ or more. Thus, the on-voltage of the diode region 20 can be suppressed low.

(Modified Example)

Figure 16:
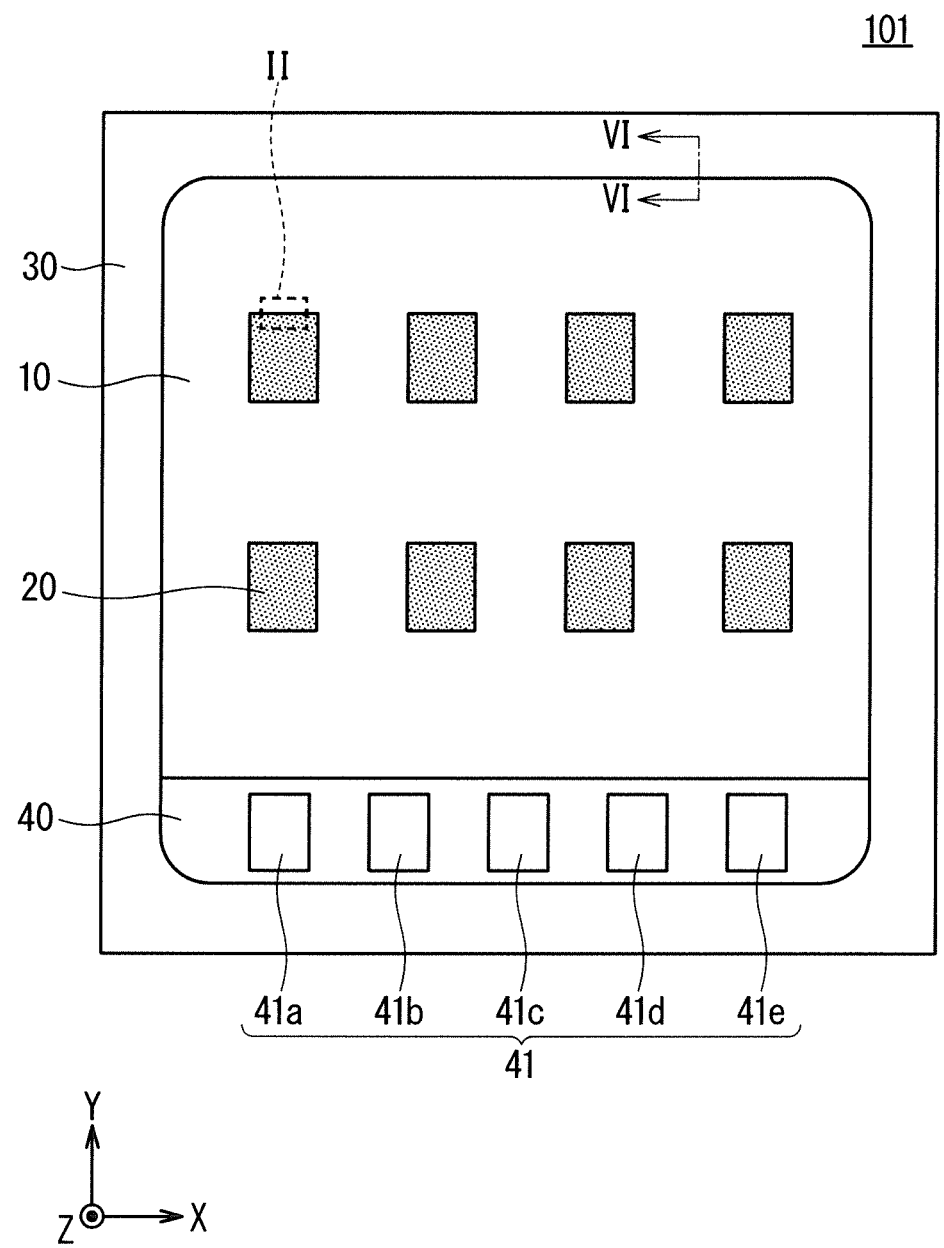
FIG. 16 is a plan view showing a modified example of FIG. 1.

FIG. 16 is a plan view showing a modified example of FIG. 1. In the present modification, a plurality of diode regions 20 is arranged side by side in each of the longitudinal direction and the lateral direction. The periphery of the diode region 20 is surrounded by the IGBT region 10. That is, the plurality of diode regions 20 are provided in islands shape in the IGBT region 10. In FIG. 16, the diode regions 20 are provided in a matrix of 4 columns in the horizontal direction on the paper and 2 rows in the vertical direction on the paper. However, the number and arrangement of the diode regions 20 are not limited thereto, and a configuration in which the peripheries of one or more diode regions 20 are surrounded by the IGBT region 10 in the IGBT region 10 can be applied.

Second Preferred Embodiment

Figure 17:
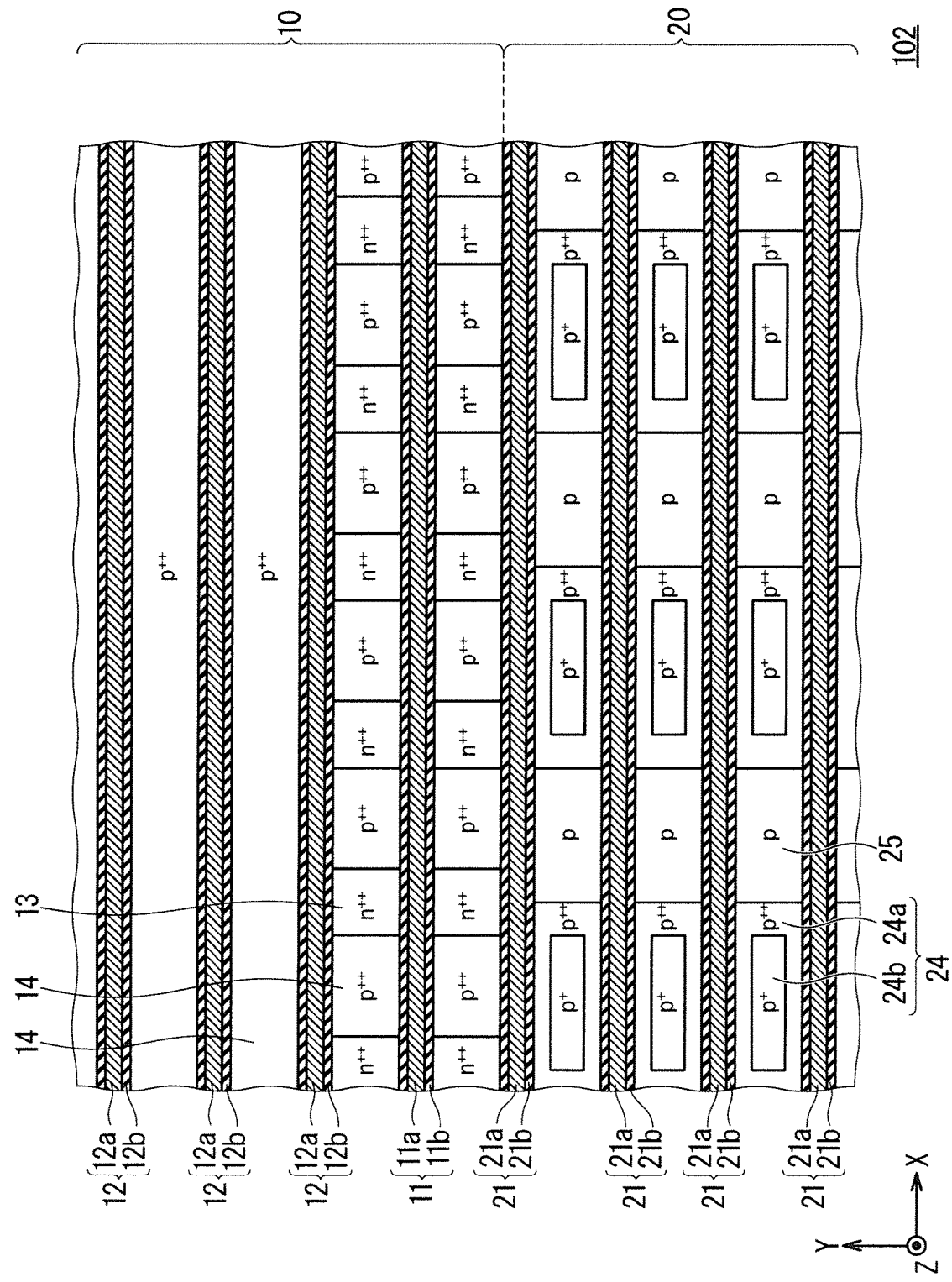
FIG. 17 is a partial plan view schematically showing, in a view similar to FIG. 2, a configuration of a reverse conducting semiconductor device along a first principal surface of a semiconductor substrate according to a second preferred embodiment.

FIG. 17 is a partial plan view, in a view similar to FIG. 2, schematically showing a configuration of a reverse conducting semiconductor device (RC-IGBT) 102 along an upper surface (first principal surface) of a semiconductor substrate 50 according to a second preferred embodiment. In the present second preferred embodiment, unlike the first preferred embodiment (FIG. 2), the p$^+$ anode contact layer 24b is disposed inside the p$^{++}$ anode contact layer 24a so as to be surrounded by the p$^{++}$ anode contact layer 24a. It should be noted that since the configuration other than this is substantially the same as the configuration of the first preferred embodiment described above, the same or corresponding elements are denoted by the same reference numerals, and the description of the elements will not be repeated.

In common with the first and second preferred embodiments, in the p$^+$ anode contact layer 24b, a p-type is assigned by counter-doping in which acceptors are further doped into a region doped with donors. Therefore, due to variations in formation of an implantation mask for impurity doping, a part of a region to be the p-type p$^+$ anode contact layer 24b on the upper surface F1 may have n-type conductivity. When the n-type region constitutes a parasitic npn transistor, the RRSOA decreases.

According to the present second preferred embodiment (FIG. 17), as compared with the first preferred embodiment (FIG. 2), the size of each of the p$^+$ anode contact layers 24b is small, and the dimensional variation of the p$^+$ anode contact layer 24b due to the formation variation of the implantation mask is also small. Therefore, it is possible to suppress a decrease in the RRSOA due to manufacturing variation.

Third Preferred Embodiment

Figure 18:
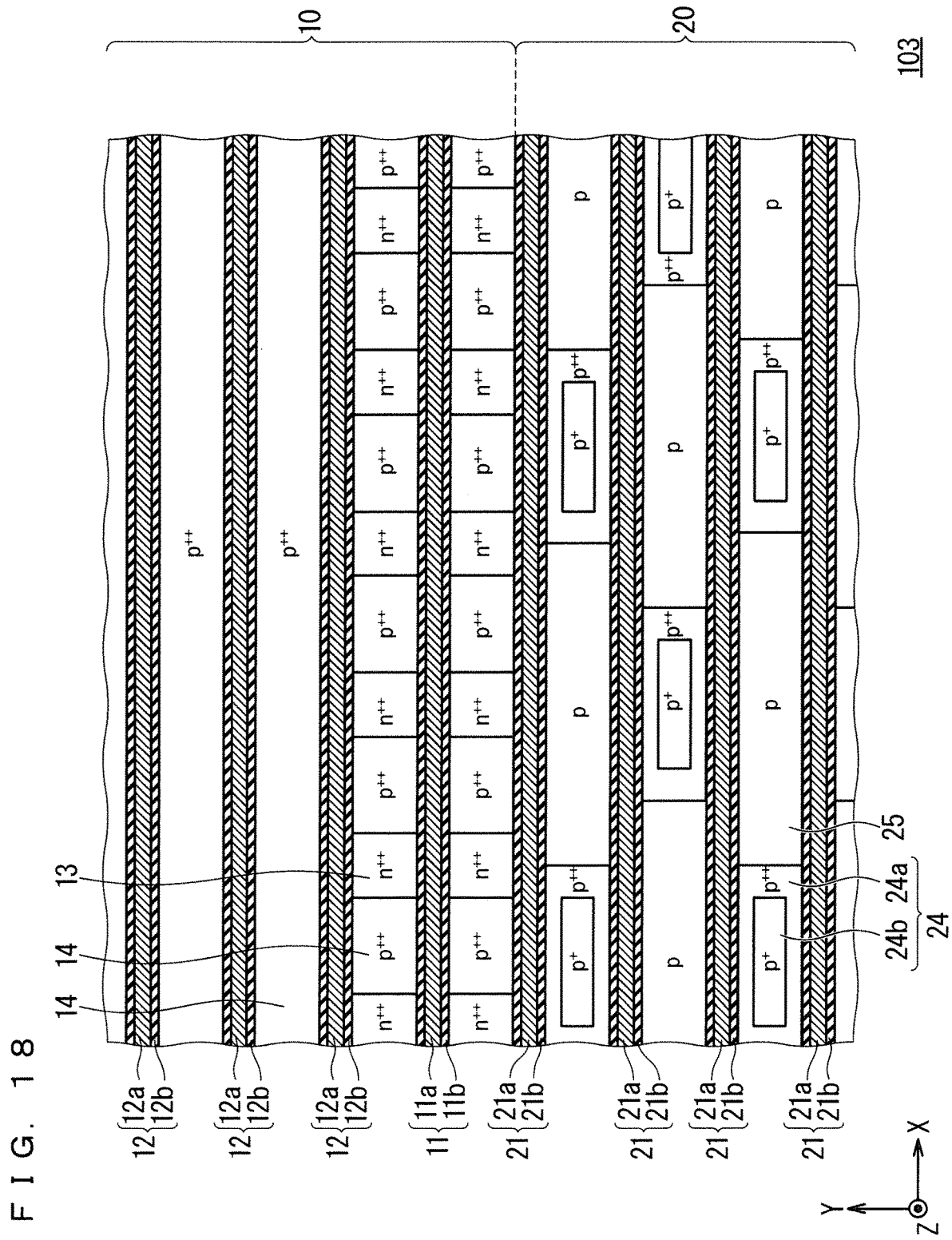
FIG. 18 is a partial plan view schematically showing, in a view similar to FIG. 2, a configuration of a reverse conducting semiconductor device along a first principal surface of a semiconductor substrate according to a third preferred embodiment.

FIG. 18 is a partial plan view, in a view similar to FIG. 17, schematically showing a configuration of a reverse conducting semiconductor device (RC-IGBT) 103 along an upper surface (first principal surface) of a semiconductor substrate 50 according to a third preferred embodiment. In the present preferred embodiment, unlike the second preferred embodiment (FIG. 17), the p$^+$ anode contact layer 24b surrounded by the p$^{++}$ anode contact layer 24a is dispersedly arranged in zigzag. It should be noted that since the configuration other than this is substantially the same as the configuration of the second preferred embodiment described above, the same or corresponding elements are denoted by the same reference numerals, and the description of the elements will not be repeated.

According to the present third preferred embodiment (FIG. 18), as compared with the second preferred embodiment (FIG. 17), the hole current density in the diode region 20 is more uniform. Thus, the heat dissipation of the diode region 20 can be enhanced.

Fourth Preferred Embodiment

Figure 19:
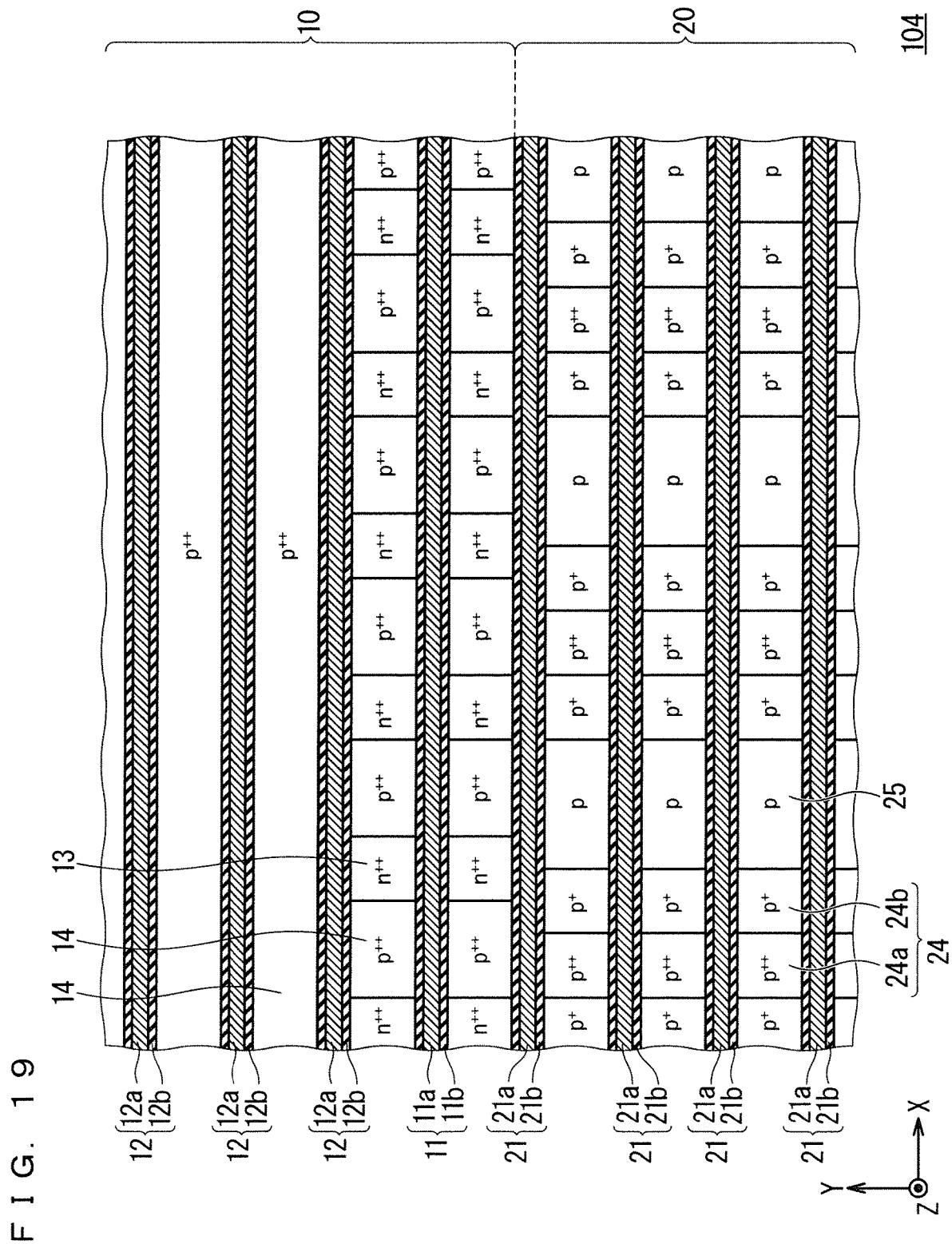
FIG. 19 is a partial plan view schematically showing, in a view similar to FIG. 2, a configuration of a reverse conducting semiconductor device along a first principal surface of a semiconductor substrate according to a fourth preferred embodiment.

FIG. 19 is a partial plan view, in a view similar to FIG. 2, schematically showing a configuration of a reverse conducting semiconductor device (RC-IGBT) 104 along an upper surface (first principal surface) of a semiconductor substrate 50 according to a fourth preferred embodiment. In the present preferred embodiment, unlike the second preferred embodiment (FIG. 2), p$^{++}$ anode contact layer 24a is disposed so as to be separated from the p-type anode layer 25 by the p$^+$ anode contact layer 24b. It should be noted that since the configuration other than this is substantially the same as the configuration of the first preferred embodiment described above, the same or corresponding elements are denoted by the same reference numerals, and the description of the elements will not be repeated.

According to the present fourth preferred embodiment (FIG. 19), as compared with the first preferred embodiment (FIG. 2), the density of holes injected into the p-type anode layer 25 is reduced. Thus, the recovery loss can be reduced.

Fifth Preferred Embodiment

Figure 20:
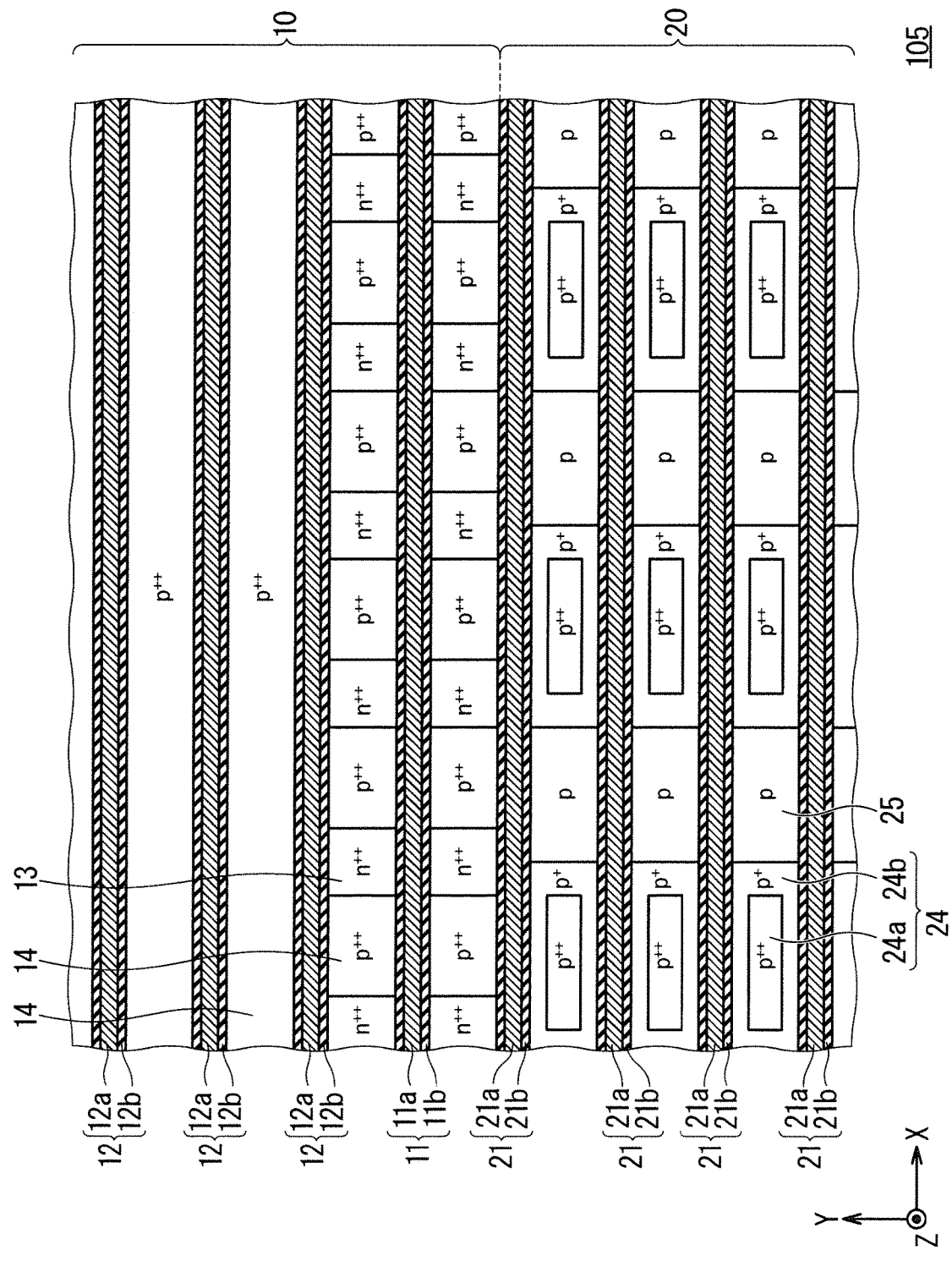
FIG. 20 is a partial plan view schematically showing, in a view similar to FIG. 2, a configuration of a reverse conducting semiconductor device along a first principal surface of a semiconductor substrate according to a fifth preferred embodiment.

FIG. 20 is a partial plan view, in a view similar to FIG. 17, schematically showing a configuration of a reverse conducting semiconductor device (RC-IGBT) 105 along an upper surface (first principal surface) of a semiconductor substrate 50 according to a fifth preferred embodiment. In the present fifth preferred embodiment, unlike the second preferred embodiment (FIG. 17), the p$^{++}$ anode contact layer 24a is disposed inside the p$^+$ anode contact layer 24b so as to be surrounded by the p$^+$ anode contact layer 24b. In other words, the arrangement of the p$^{++}$ anode contact layer 24a and the p$^+$ anode contact layer 24b is interchanged. It should be noted that since the configuration other than this is substantially the same as the configuration of the second preferred embodiment described above, the same or corresponding elements are denoted by the same reference numerals, and the description of the elements will not be repeated.

According to the present preferred embodiment, the density of holes injected into the p-type anode layer 25 is reduced. Thus, the recovery loss can be reduced.

Sixth Preferred Embodiment

Figure 21:
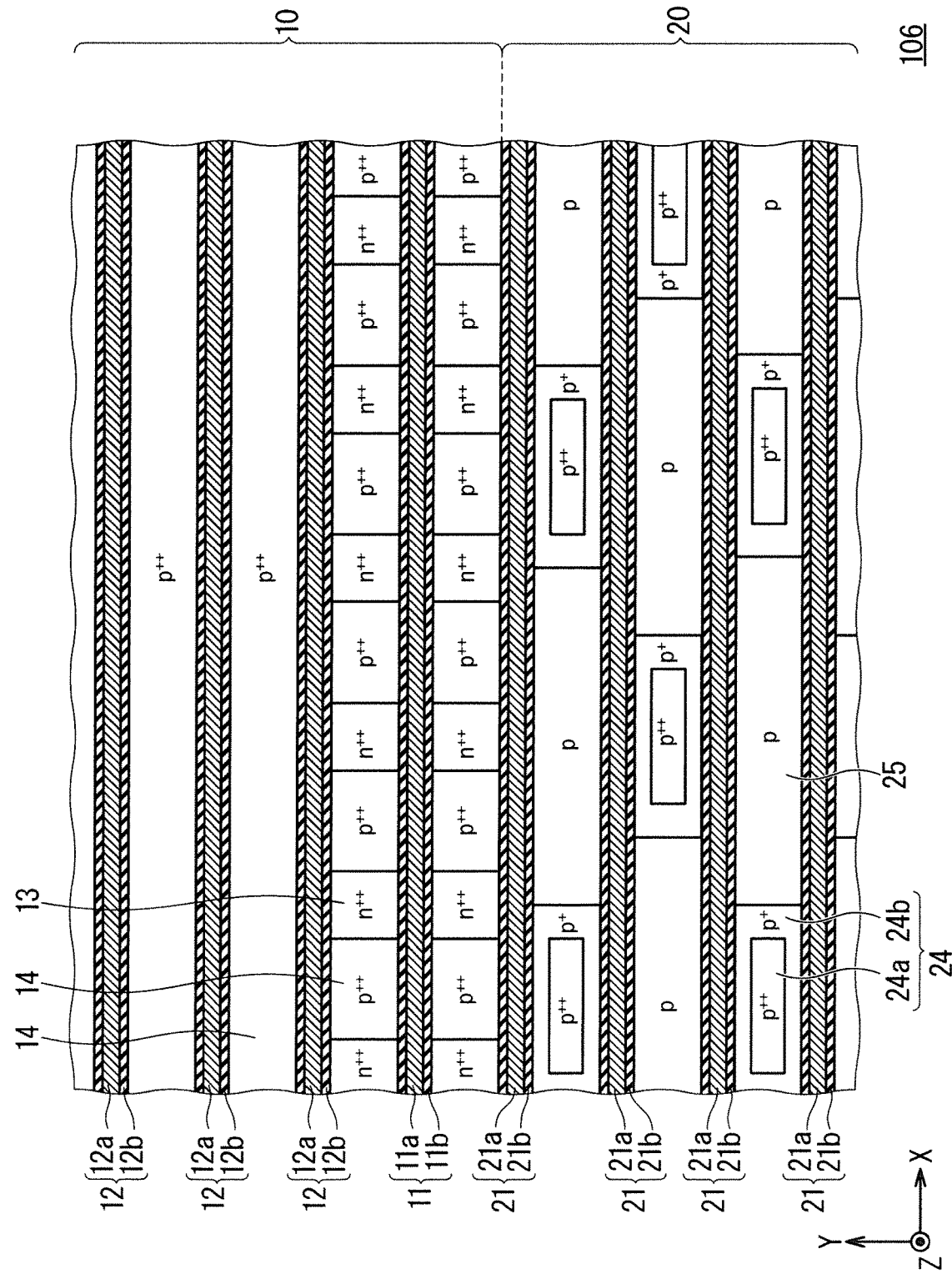
FIG. 21 is a partial plan view schematically showing, in a view similar to FIG. 2, a configuration of a reverse conducting semiconductor device along a first principal surface of a semiconductor substrate according to a sixth preferred embodiment.

FIG. 21 is a partial plan view, in a view similar to FIG. 2, schematically showing a configuration of a reverse conducting semiconductor device (RC-IGBT) 106 along an upper surface (first principal surface) of a semiconductor substrate 50 according to a sixth preferred embodiment. In the present preferred embodiment, unlike the fifth preferred embodiment (FIG. 20), the p$^{++}$ anode contact layer 24a surrounded by the p$^+$ anode contact layer 24b is dispersedly arranged in zigzag. It should be noted that since the configuration other than this is substantially the same as the configuration of the fifth preferred embodiment described above, the same or corresponding elements are denoted by the same reference numerals, and the description of the elements will not be repeated.

According to the present sixth preferred embodiment (FIG. 21), as compared with the fifth preferred embodiment (FIG. 20), the hole current density in the diode region 20 is more uniform. Thus, the heat dissipation of the diode region 20 can be enhanced.

Seventh Preferred Embodiment

Figure 22:
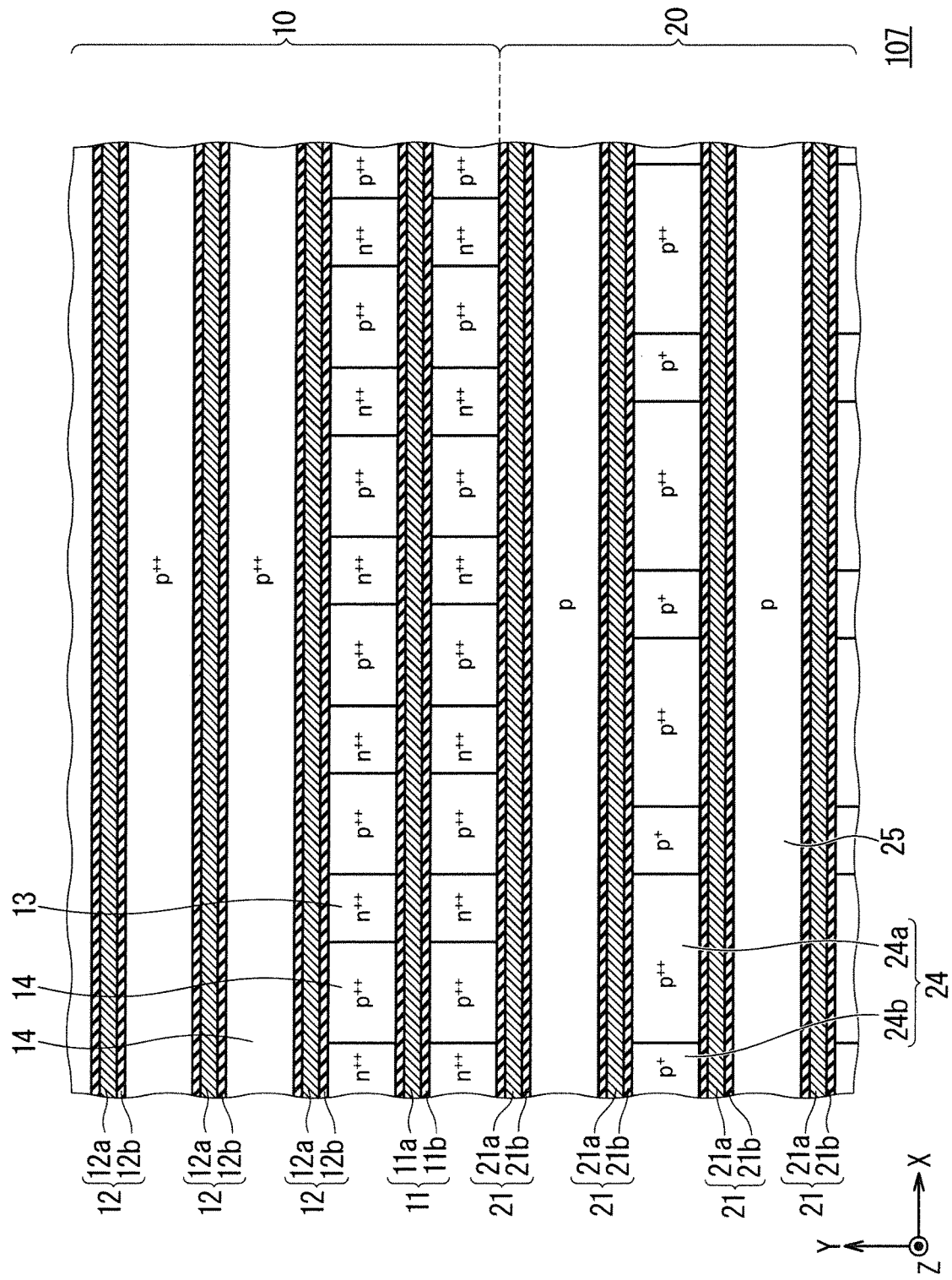
FIG. 22 is a partial plan view schematically showing, in a view similar to FIG. 2, a configuration of a reverse conducting semiconductor device along a first principal surface of a semiconductor substrate according to a seventh preferred embodiment.

FIG. 22 is a partial plan view, in a view similar to FIG. 2, schematically showing a configuration of a reverse conducting semiconductor device (RC-IGBT) 107 along an upper surface (first principal surface) of a semiconductor substrate 50 according to a seventh preferred embodiment. In the present seventh preferred embodiment, unlike the first preferred embodiment (FIG. 2), of a plurality of mesa regions of the semiconductor substrate 50 divided by the diode trench gate 21, on the upper surface of some mesa regions, only the p-type anode layer 25 is disposed and the p$^{++}$ anode contact layer 24a and the p$^+$ anode contact layer 24b are not disposed, and on the upper surface of other mesa regions, only the p$^{++}$ anode contact layer 24a and the p$^+$ anode contact layer 24b are disposed and the p-type anode layer 25 is not disposed. It should be noted that since the configuration other than this is substantially the same as the configuration of the first preferred embodiment described above, the same or corresponding elements are denoted by the same reference numerals, and the description of the elements will not be repeated.

According to the present preferred embodiment, it is possible to reduce the influence of dimensional variation in the X direction (direction parallel to the extending direction of the trench) of the p$^{++}$ anode contact layer 24a and the p$^+$ anode contact layer 24b.

Eighth Preferred Embodiment

Figure 23:
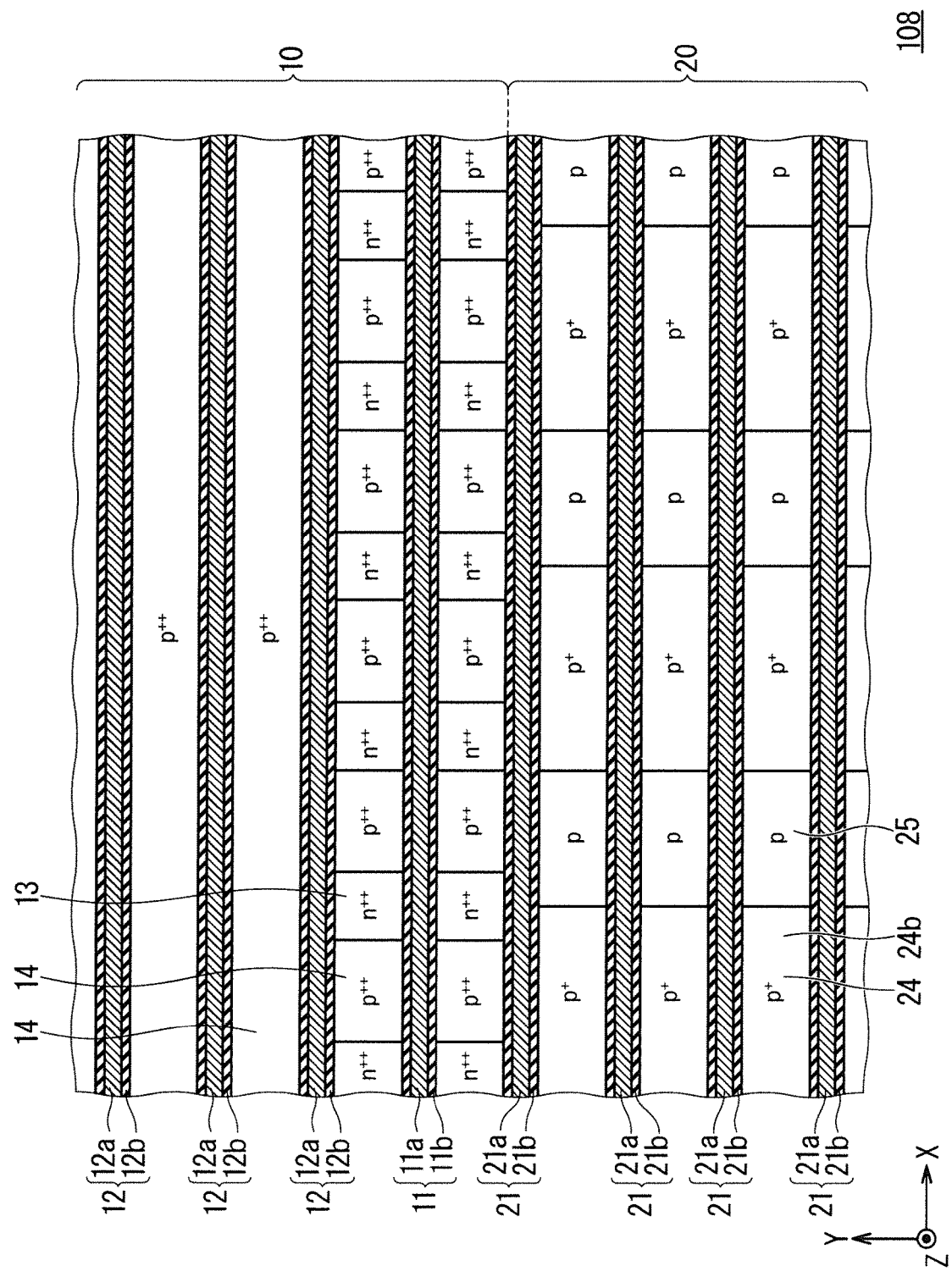
FIG. 23 is a partial plan view schematically showing, in a view similar to FIG. 2, a configuration of a reverse conducting semiconductor device along a first principal surface of a semiconductor substrate according to an eighth preferred embodiment.

FIG. 23 is a partial plan view, in a view similar to FIG. 2, schematically showing a configuration of a reverse conducting semiconductor device (RC-IGBT) 108 along an upper surface (first principal surface) of a semiconductor substrate 50 according to an eighth preferred embodiment. In the present eighth preferred embodiment, unlike the first preferred embodiment (FIG. 2), the p$^{++}$ anode contact layer 24a is omitted. Thus, in each of the plurality of mesa regions of the semiconductor substrate 50 divided by the diode trench gates 21, the p$^+$ anode contact layer 24b and the p-type anode layer 25 are alternately arranged in contact with each other in the X direction (direction parallel to the extending direction of the trench). It should be noted that since the configuration other than this is substantially the same as the configuration of the first preferred embodiment described above, the same or corresponding elements are denoted by the same reference numerals, and the description of the elements will not be repeated.

According to the present eighth preferred embodiment (FIG. 23), the density of holes injected into the p-type anode layer 25 is reduced. Thus, the recovery loss can be reduced.

Ninth Preferred Embodiment

Figure 24:
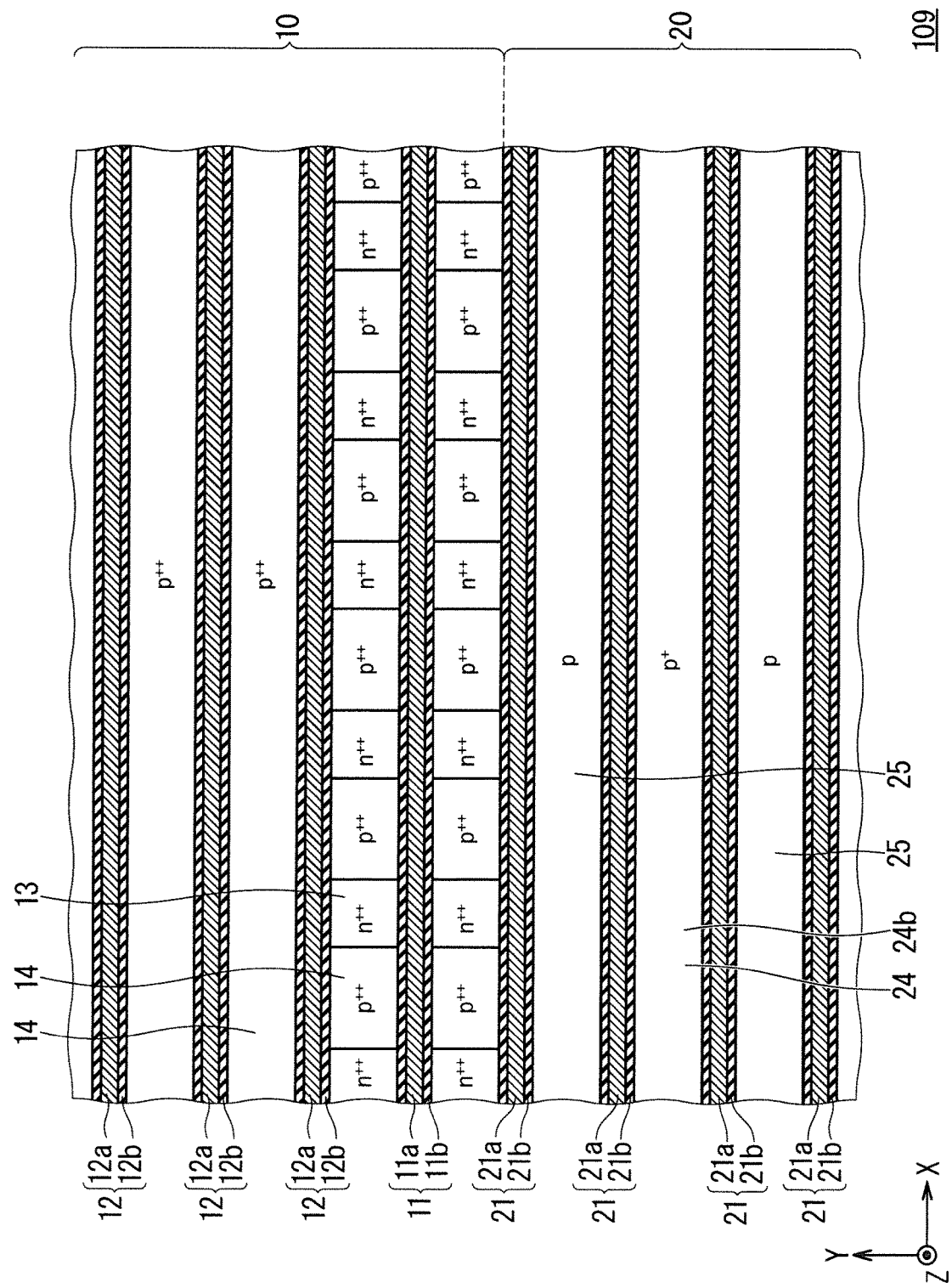
FIG. 24 is a partial plan view schematically showing, in a view similar to FIG. 2, a configuration of a reverse conducting semiconductor device along a first principal surface of a semiconductor substrate according to a ninth preferred embodiment.

FIG. 24 is a partial plan view, in a view similar to FIG. 2, schematically showing a configuration of a reverse conducting semiconductor device (RC-IGBT) 109 along an upper surface (first principal surface) of a semiconductor substrate 50 according to a ninth preferred embodiment. Also in the present ninth preferred embodiment, similarly to the eighth preferred embodiment (FIG. 23), the p$^{++}$ anode contact layer 24a (see FIG. 2) is omitted. Then, in the present ninth preferred embodiment, unlike the eighth preferred embodiment, of a plurality of mesa regions of the semiconductor substrate 50 divided by the diode trench gates 21, on the upper surface of some mesa regions, only the p-type anode layer 25 is disposed and the p$^+$ anode contact layer 24b is not disposed, and on the upper surface of other mesa regions, only the p$^+$ anode contact layer 24b is disposed and the p-type anode layer 25 is not disposed. It should be noted that since the configuration other than this is substantially the same as the configuration of the first preferred embodiment described above, the same or corresponding elements are denoted by the same reference numerals, and the description of the elements will not be repeated.

According to the present preferred embodiment, it is possible to reduce the influence of dimensional variation in the X direction (direction parallel to the extending direction of the trench) of the p$^+$ anode contact layer 24b.

Tenth Preferred Embodiment

In the present tenth preferred embodiment, the impurity concentration profile of the semiconductor substrate 50 included in the RC-IGBT 100 described in the first preferred embodiment will be described in more detail.

Figure 25:
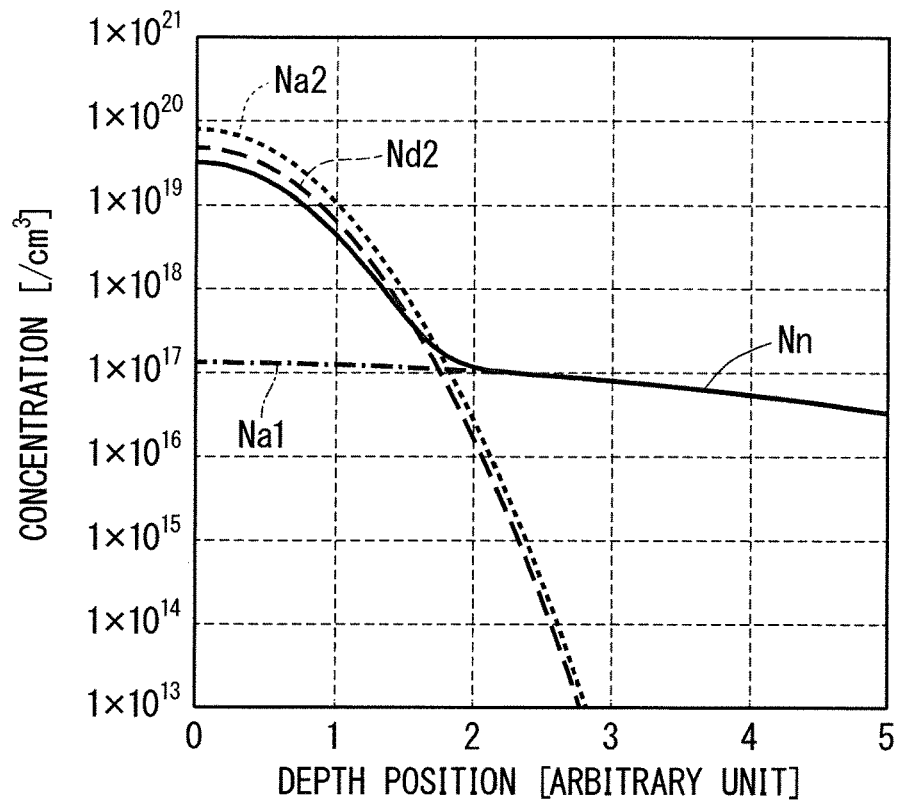
FIG. 25 is a graph showing an example of a concentration profile of a semiconductor substrate included in a reverse conducting semiconductor device according to a tenth preferred embodiment in a depth range of an alternate long and short dash line DD in FIG. 3.

FIG. 25 is a graph showing, in a depth range of an alternate long and short dash line DD (FIG. 3), an example of a concentration profile of the semiconductor substrate 50 included in the RC-IGBT 100 according to the present tenth preferred embodiment. In this graph, the concentration Na1 represents an acceptor implantation profile for forming the p-type anode layer 25. The concentration Na1+concentration Na2 represents an acceptor implantation profile for forming the p$^+$ anode contact layer 24b. The concentration Nd2 represents a donor implantation profile for forming the p$^+$ anode contact layer 24b. The net concentration Nn represents a net concentration obtained from the acceptor concentration of the concentration Na1+concentration Na2 and the donor concentration of the concentration Nd2.

The peak concentration of the net concentration Nn of the p-type anode layer 25 (region where the depth position is about 2 μm or more) is 1×10$^{16}$/cm$^3$ or more. The peak concentration of the net concentration Nn of the p$^+$ anode contact layer 24b (region where the depth position is about 2 μm or less) is 1×10$^{18}$/cm$^3$ or more.

Figure 26:
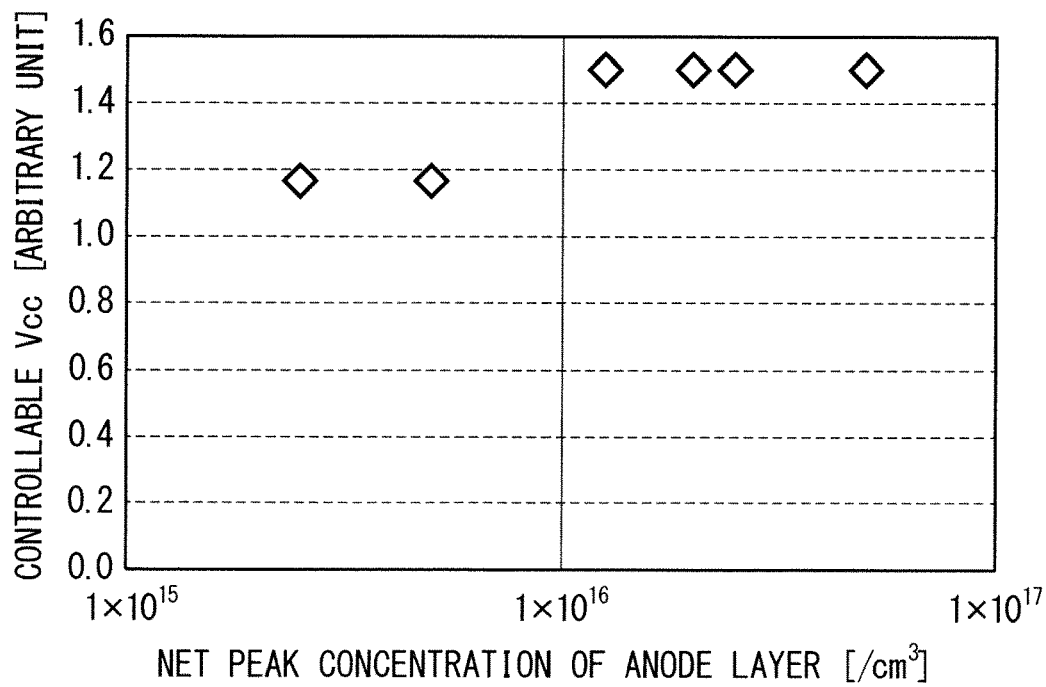
FIG. 26 is a graph showing an example of a measurement result of a relationship between a net peak concentration of an anode layer and a controllable Vcc in a reverse conducting semiconductor device according to the tenth preferred embodiment.

FIG. 26 is a graph showing the relationship between the net peak concentration of the p-type anode layer 25 and the controllable Vcc measured in the RRSOA test in the RC-IGBT 100 according to the present tenth preferred embodiment. It should be noted that Vcc is a DC power supply voltage applied between the collector and the emitter, and the controllable Vcc is the maximum Vcc at which device breakdown did not occur in the RRSOA test. The net peak concentration values (/cm$^3$) plotted were 2.5×10$^{15}$, 5.0×10$^{15}$, 1.2×10$^{16}$, 2.0×10$^{16}$, 2.5×10$^{16}$, and 5.0×10$^{16}$. From this result, it is found that setting the net peak concentration of the p-type anode layer 25 to 1.2×10$^{16}$/cm$^3$ or more allows the decrease in the RRSOA to be suppressed. In addition, from the overall tendency of the plot, it is considered that setting the net peak concentration of the p-type anode layer 25 to about 1×10$^{16}$/cm$^3$ or more allows the decrease in the RRSOA to be suppressed.

Figure 27:
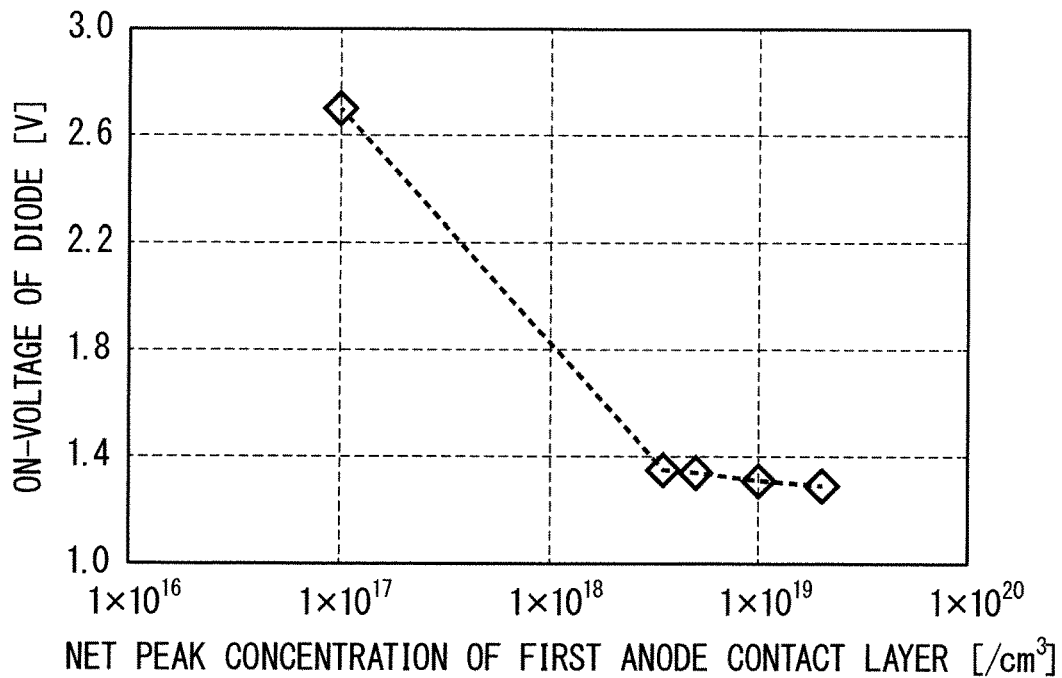
FIG. 27 is a graph showing an example of a measurement result of a relationship between a net peak concentration of a first anode contact layer and an on-voltage of a diode in a reverse conducting semiconductor device according to the tenth preferred embodiment.

FIG. 27 is a graph showing an example of a measurement result of a relationship between the net peak concentration of the p$^+$ anode contact layer 24b (first anode contact layer) and the on-voltage of the diode configured by the diode region 20 in the RC-IGBT 100 according to the present tenth preferred embodiment. The net peak concentration values (cm$^3$) plotted were 1.0×10$^{17}$, 3.5×10$^{18}$, 5.0×10$^{18}$, 1.0×10$^{19}$, and 2.0×10$^{19}$. This result shows that setting the net peak concentration of the p$^+$ anode contact layer 24b to 3.5×10$^{18}$ or more allows the on-voltage of the diode to be remarkably reduced. In addition, from the overall tendency of the plot, it is considered that setting the net peak concentration of the p$^+$ anode contact layer 24b to about 1×10$^{18}$/cm$^3$ or more allows the on-voltage of the diode to be reduced. The reduction in the on-voltage is considered to be due to the reduction in contact resistance between the emitter electrode 5 and the p$^+$ anode contact layer 24b.

Eleventh Preferred Embodiment

Figure 28:
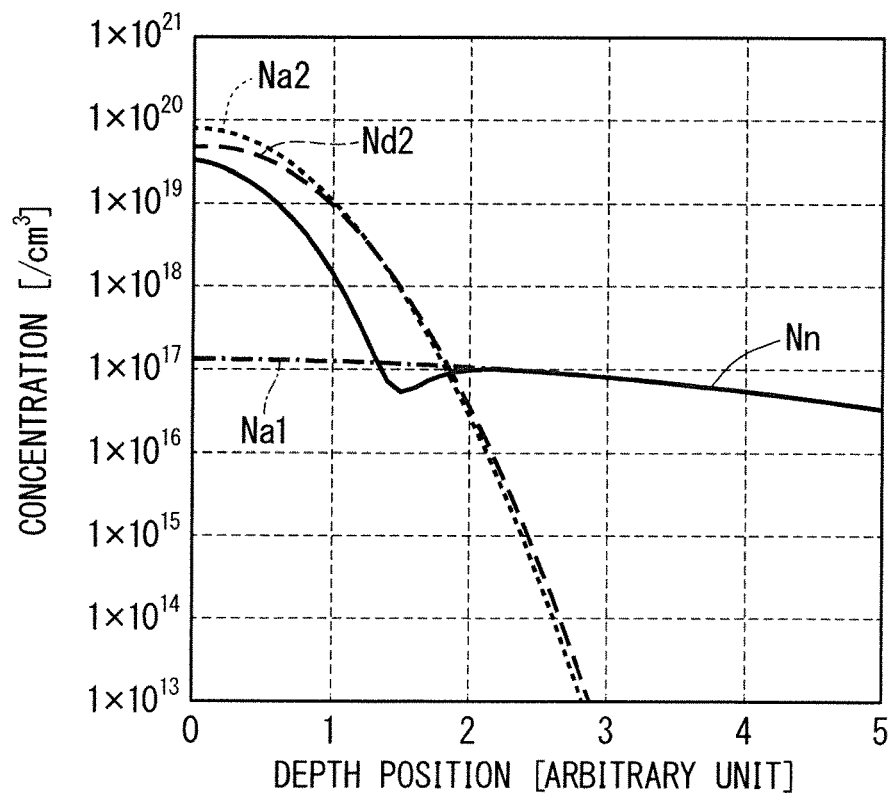
FIG. 28 is a graph showing an example of a concentration profile of a semiconductor substrate included in a reverse conducting semiconductor device according to an eleventh preferred embodiment in a depth range of an alternate long and short dash line in FIG. 2.

FIG. 28 is a modified example of FIG. 25 (tenth preferred embodiment) and shows an impurity concentration profile of the semiconductor substrate 50 in the present eleventh preferred embodiment. In the present eleventh preferred embodiment, in the diode region 20, the semiconductor substrate 50 has the minimum value of the profile of the net concentration Nn in the thickness direction at the depth position between the p$^+$ anode contact layer 24b (left region in the figure) and the p-type anode layer 25 (right region in the figure). Thus, the hole injection efficiency in the diode region 20 is reduced. Therefore, the recovery loss of the diode region 20 can be reduced.

Twelfth Preferred Embodiment

Figure 29:
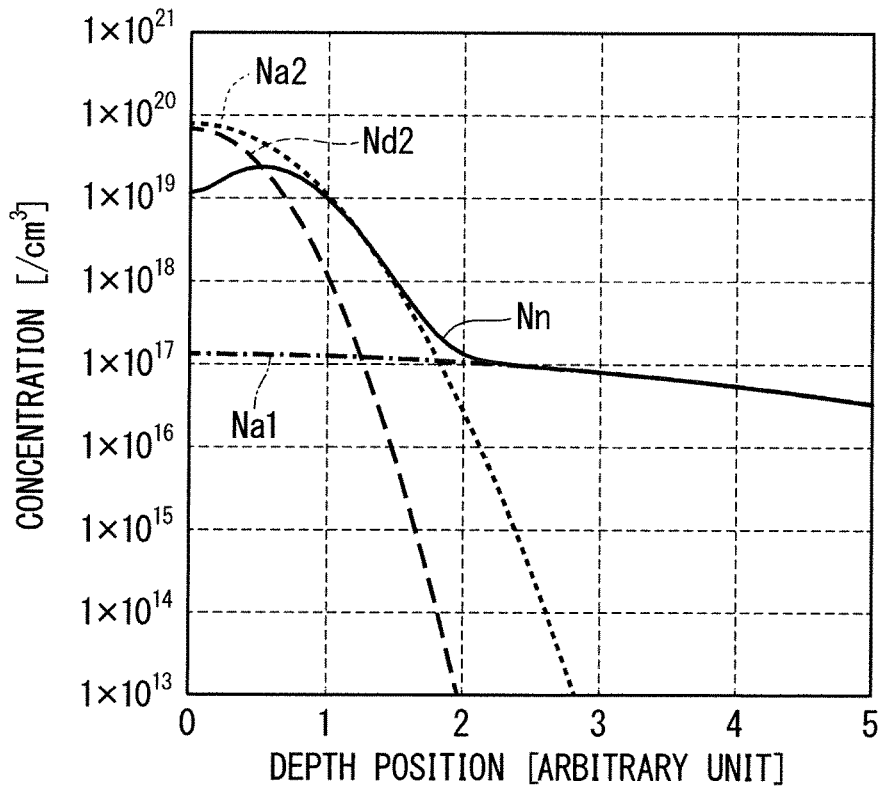
FIG. 29 is a graph showing an example of a concentration profile of a semiconductor substrate included in a reverse conducting semiconductor device according to a twelfth preferred embodiment in a depth range of an alternate long and short dash line in FIG. 2.

FIG. 29 is a modified example of FIG. 25 (tenth preferred embodiment) and shows an impurity concentration profile of the semiconductor substrate 50 in the present twelfth preferred embodiment. In the present twelfth preferred embodiment, the p$^+$ anode contact layer 24b (left region in the figure) has a peak value of the profile of the net concentration Nn in the thickness direction at a depth position away from the upper surface (0 depth position). Thus, the hole injection efficiency in the diode region 20 is reduced. Therefore, the recovery loss of the diode region 20 can be reduced.

Thirteenth Preferred Embodiment

Figure 30:
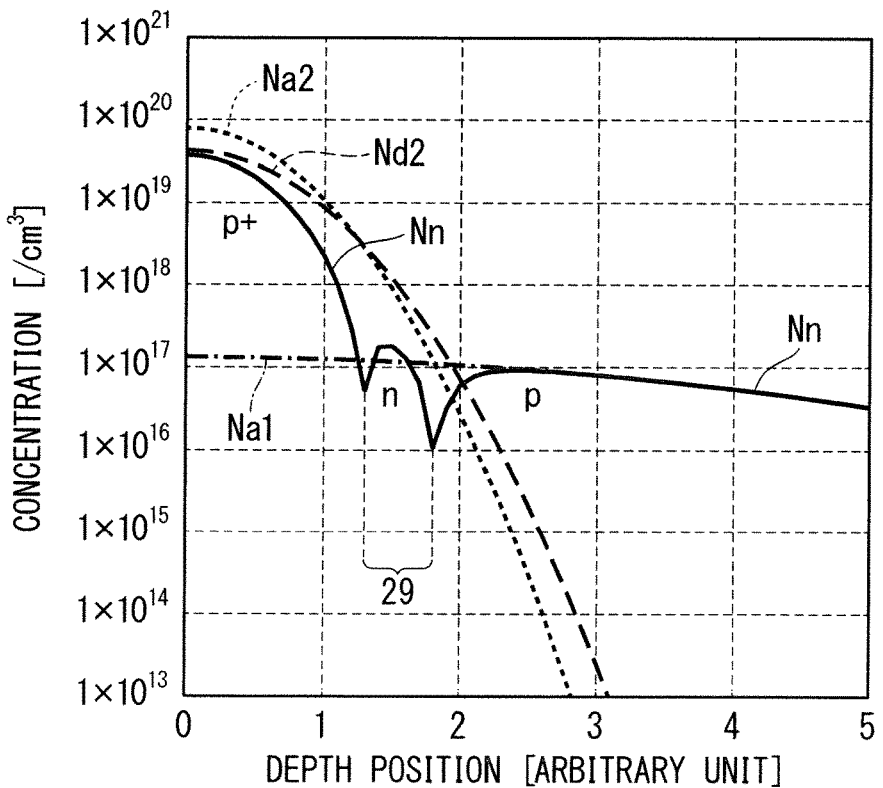
FIG. 30 is a graph showing an example of a concentration profile of a semiconductor substrate included in a reverse conducting semiconductor device according to a thirteenth preferred embodiment in a depth range of an alternate long and short dash line in FIG. 2.

FIG. 30 is a modified example of FIG. 25 (tenth preferred embodiment) and shows an impurity concentration profile of the semiconductor substrate 50 in the present thirteenth preferred embodiment. In the present thirteenth preferred embodiment, the semiconductor substrate 50 includes the interposing layer 29 having n-type conductivity between the p$^+$ anode contact layer 24b and the p-type anode layer 25 in the thickness direction in the diode region 20. Thus, the hole injection efficiency in the diode region 20 is reduced. Therefore, the recovery loss of the diode region 20 can be reduced.

It should be noted that each preferred embodiment can be freely combined, and each preferred embodiment can be appropriately modified, or omitted. In addition, a certain preferred embodiment can also be partially applied to another preferred embodiment.

While the disclosure has been shown and described in detail, the foregoing description is in all aspects illustrative and not restrictive. It is therefore understood that numerous modifications and variations can be devised.

What is claimed is:

1. A reverse conducting semiconductor device having an insulated gate bipolar transistor region and a diode region, the reverse conducting semiconductor device comprising:
   a semiconductor substrate included in the insulated gate bipolar transistor region and the diode region, the semiconductor substrate having a first principal surface and a second principal surface opposite to the first principal surface, the semiconductor substrate including
      a drift layer extending over the insulated gate bipolar transistor region and the diode region and having a first conductivity type,
      a base layer arranged between the drift layer and the first principal surface in the insulated gate bipolar transistor region, the base layer having a second conductivity type different from the first conductivity type,
      an emitter layer arranged between the base layer and the first principal surface in the insulated gate bipolar transistor region, the emitter layer having the first conductivity type,
      a base contact layer arranged between the base layer and the first principal surface in the insulated gate bipolar transistor region, the base contact layer forming a part of the first principal surface, the base contact layer having the second conductivity type,
      a collector layer arranged between the drift layer and the second principal surface in the insulated gate bipolar transistor region, the collector layer having the second conductivity type,
      an anode layer arranged between the drift layer and the first principal surface in the diode region, the anode layer having the second conductivity type,
      an anode contact region arranged between the anode layer and the first principal surface in the diode region, the anode contact region forming a part of the first principal surface, the anode contact region having a second conductivity type impurity concentration peak value higher than that of the anode layer, the anode contact region having the second conductivity type, and
      a cathode layer arranged between the drift layer and the second principal surface in the diode region, the cathode layer having the first conductivity type;
   an insulated gate structure for forming, with the base layer, a channel for controlling an electrical path between the emitter layer and the drift layer;
   a collector electrode electrically connected to the collector layer and the cathode layer; and
   an emitter electrode in contact with the base contact layer and the anode contact region,
   wherein the anode contact region includes a first anode contact layer having a lower net concentration and a higher first conductivity type impurity concentration than the base contact layer.

2. The reverse conducting semiconductor device according to claim 1,
   wherein the anode contact region includes a second anode contact layer, and
   wherein the first anode contact layer has a lower net concentration than the second anode contact layer.

3. The reverse conducting semiconductor device according to claim 2, wherein the first anode contact layer has a higher first conductivity type impurity concentration than the second anode contact layer.

4. The reverse conducting semiconductor device according to claim 1, wherein the first principal surface does not have the first conductivity type in the diode region.

5. The reverse conducting semiconductor device according to claim 1, wherein the anode layer forms a part of the first principal surface.

6. The reverse conducting semiconductor device according to claim 1, wherein a net peak concentration of the anode layer is $1 \times 10^{16}/\text{cm}^3$ or more.

7. The reverse conducting semiconductor device according to claim 1, wherein a net peak concentration of the first anode contact layer is $1 \times 10^{18}/\text{cm}^3$ or more.

8. The reverse conducting semiconductor device according to claim 1, wherein in the diode region, the semiconductor substrate has a minimum value of a net concentration profile in a thickness direction at a depth position between the first anode contact layer and the anode layer.

9. The reverse conducting semiconductor device according to claim 1, wherein the first anode contact layer has a peak value of a net concentration profile in a thickness direction at a depth position away from the first principal surface.

10. The reverse conducting semiconductor device according to claim 1, wherein the semiconductor substrate includes an interposing layer having a first conductivity type between the first anode contact layer and the anode layer in a thickness direction in the diode region.

11. A method for manufacturing a reverse conducting semiconductor device for manufacturing the reverse conducting semiconductor device according to claim 1, the method comprising:
- performing first conductivity type impurity doping of the emitter layer by ion implantation into the first principal surface of the semiconductor substrate; and
- performing first conductivity type impurity doping of the first anode contact layer by ion implantation into the first principal surface of the semiconductor substrate,
- wherein the first conductivity type impurity doping of the emitter layer and the first conductivity type impurity doping of the first anode contact layer are simultaneously performed as a common first conductivity type impurity doping.

12. The method for manufacturing a reverse conducting semiconductor device according to claim 11, further comprising:
- performing second conductivity type impurity doping of the base contact layer by ion implantation into the first principal surface of the semiconductor substrate; and
- performing second conductivity type impurity doping of the first anode contact layer by ion implantation into the first principal surface of the semiconductor substrate,
- wherein the second conductivity type impurity doping of the base contact layer and the second conductivity type impurity doping of the first anode contact layer are simultaneously performed as a common second conductivity type impurity doping.

13. The method for manufacturing a reverse conducting semiconductor device according to claim 12, wherein an implantation amount of first conductivity type impurity ions per unit area in the common first conductivity type impurity doping is lower than an implantation amount of second conductivity type impurity ions per unit area in the common second conductivity type impurity doping.

* * * * *